(12) United States Patent
Iwatsu

(10) Patent No.: US 8,664,106 B2
(45) Date of Patent: Mar. 4, 2014

(54) METHOD OF MANUFACTURING SEMICONDUCTOR DEVICE

(75) Inventor: Haruo Iwatsu, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 76 days.

(21) Appl. No.: 13/394,573

(22) PCT Filed: Sep. 7, 2010

(86) PCT No.: PCT/JP2010/065312
§ 371 (c)(1),
(2), (4) Date: Mar. 7, 2012

(87) PCT Pub. No.: WO2011/030753
PCT Pub. Date: Mar. 17, 2011

(65) Prior Publication Data
US 2012/0171858 A1    Jul. 5, 2012

(30) Foreign Application Priority Data
Sep. 9, 2009  (JP) ................. 2009-207971

(51) Int. Cl.
*H01L 21/44*      (2006.01)
(52) U.S. Cl.
USPC ........... 438/612; 438/107; 438/598; 438/666; 438/667; 438/674
(58) Field of Classification Search
USPC .................. 438/107, 598, 612, 666, 667, 674
See application file for complete search history.

(56) References Cited

U.S. PATENT DOCUMENTS

| 7,393,771 B2 * | 7/2008 | Hozoji et al. ................. 438/610 |
| 2003/0096494 A1 | 5/2003 | Sakuyama et al. |
| 2005/0150684 A1 | 7/2005 | Hashimoto |
| 2009/0023243 A1* | 1/2009 | Koyanagi ..................... 438/107 |
| 2010/0248424 A1* | 9/2010 | Luce et al. ..................... 438/109 |
| 2011/0008632 A1* | 1/2011 | Zheng et al. ................. 428/457 |

FOREIGN PATENT DOCUMENTS

| JP | 2002-359470 | 12/2002 |
| JP | 2003-332371 | 11/2003 |
| JP | 2004-119646 | 4/2004 |
| JP | 2004-320064 | 11/2004 |
| JP | 2004-327908 | 11/2004 |
| JP | 2005-203468 | 7/2005 |
| JP | 2005-203664 | 7/2005 |
| JP | 2005-302858 | 10/2005 |
| JP | 2009-049051 | 3/2009 |

OTHER PUBLICATIONS

International Search Report mailed on Dec. 14, 2010.

* cited by examiner

*Primary Examiner* — Bac Au
(74) *Attorney, Agent, or Firm* — IPUSA, PLLC

(57) ABSTRACT

A method of manufacturing a semiconductor device, wherein a first substrate where first electrode pads are formed and a second substrate where second electrode pads are formed are stacked and the first electrode pads and the corresponding second electrode pads are electrically connected thereby forming the semiconductor device is disclosed. The method includes steps of performing a first hydrophilic treatment with respect to the first electrode pads; supplying liquid to a surface where the first electrode pads are formed in the first substrate; and placing the second substrate on the first substrate to which the liquid is supplied so that the surface where the first electrode pads are formed opposes a surface where the second electrode pads are formed, thereby aligning the first electrode pads and the second electrode pads by the liquid that gathers in the first electrode pads that have been subject to the first hydrophilic treatment.

8 Claims, 18 Drawing Sheets

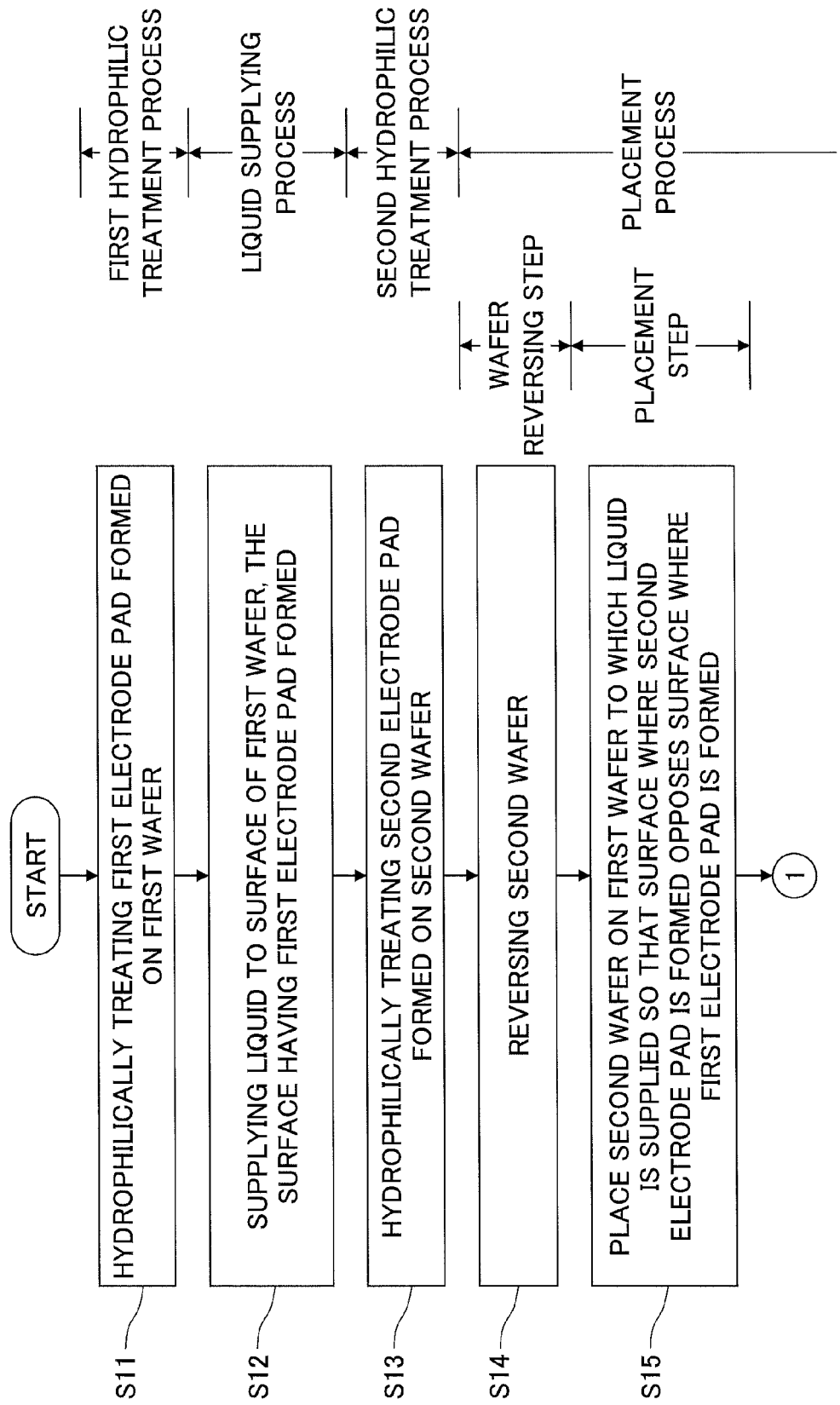

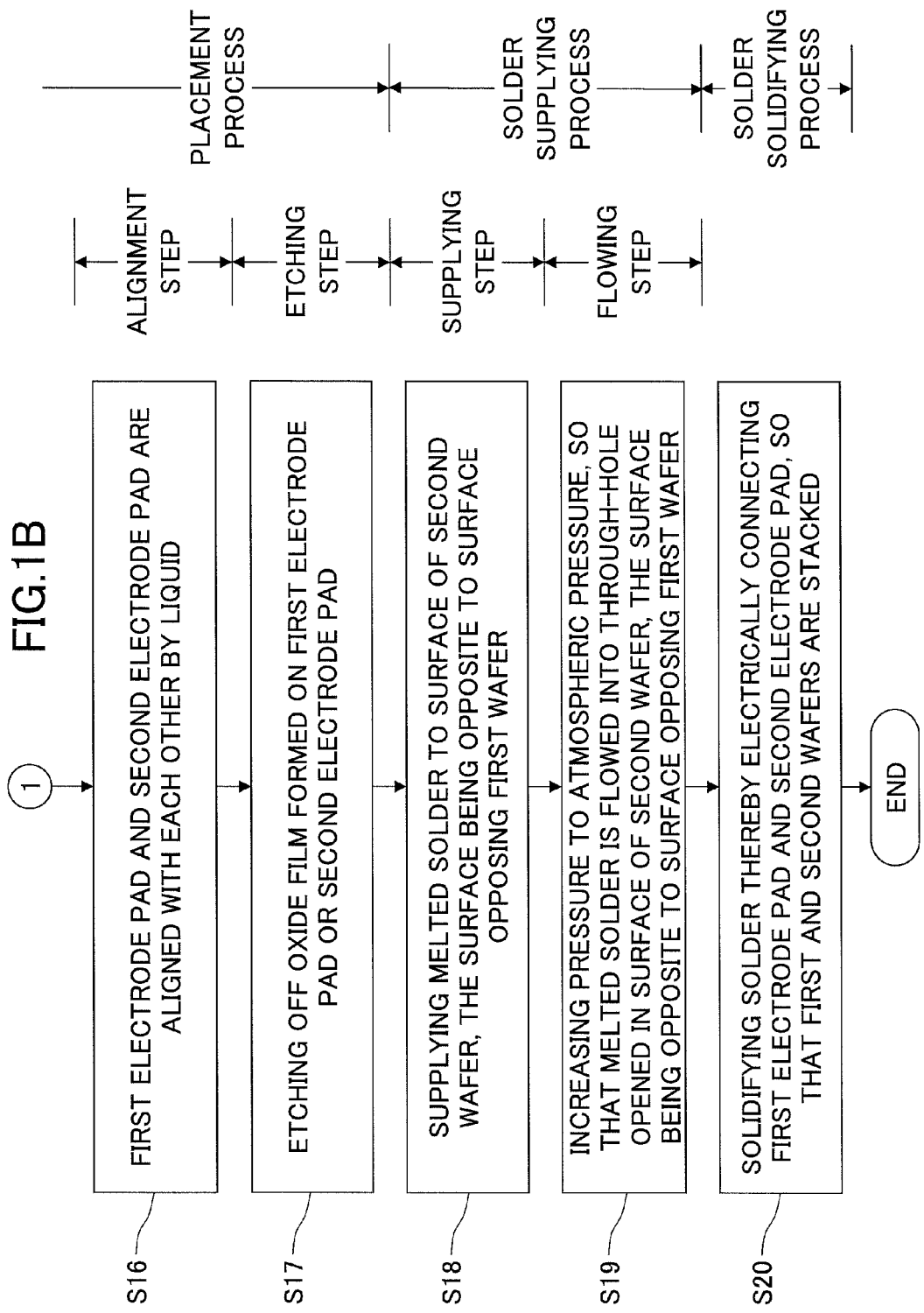

FIG.2A
(a)
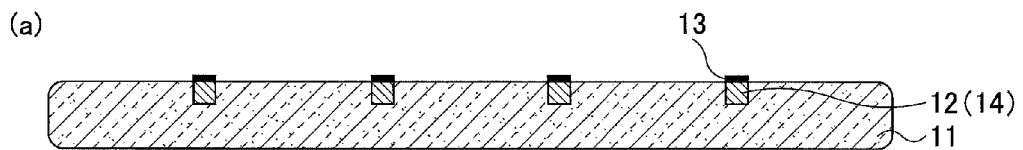
(b)
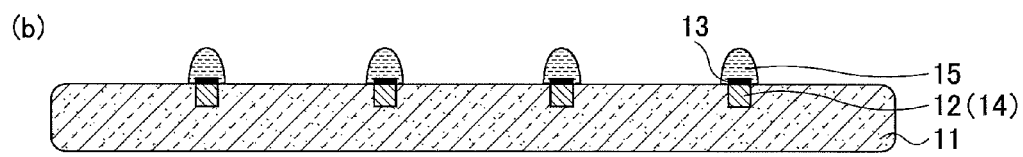
(c)
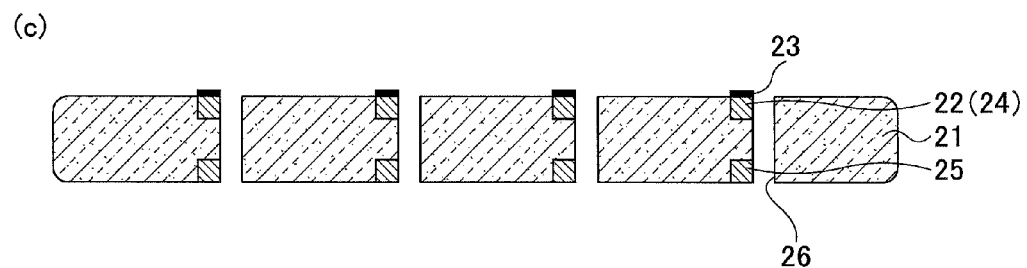
(d)
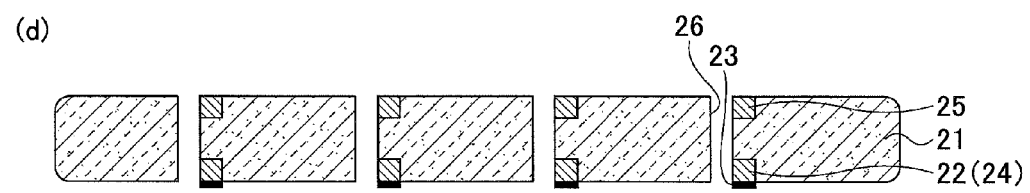

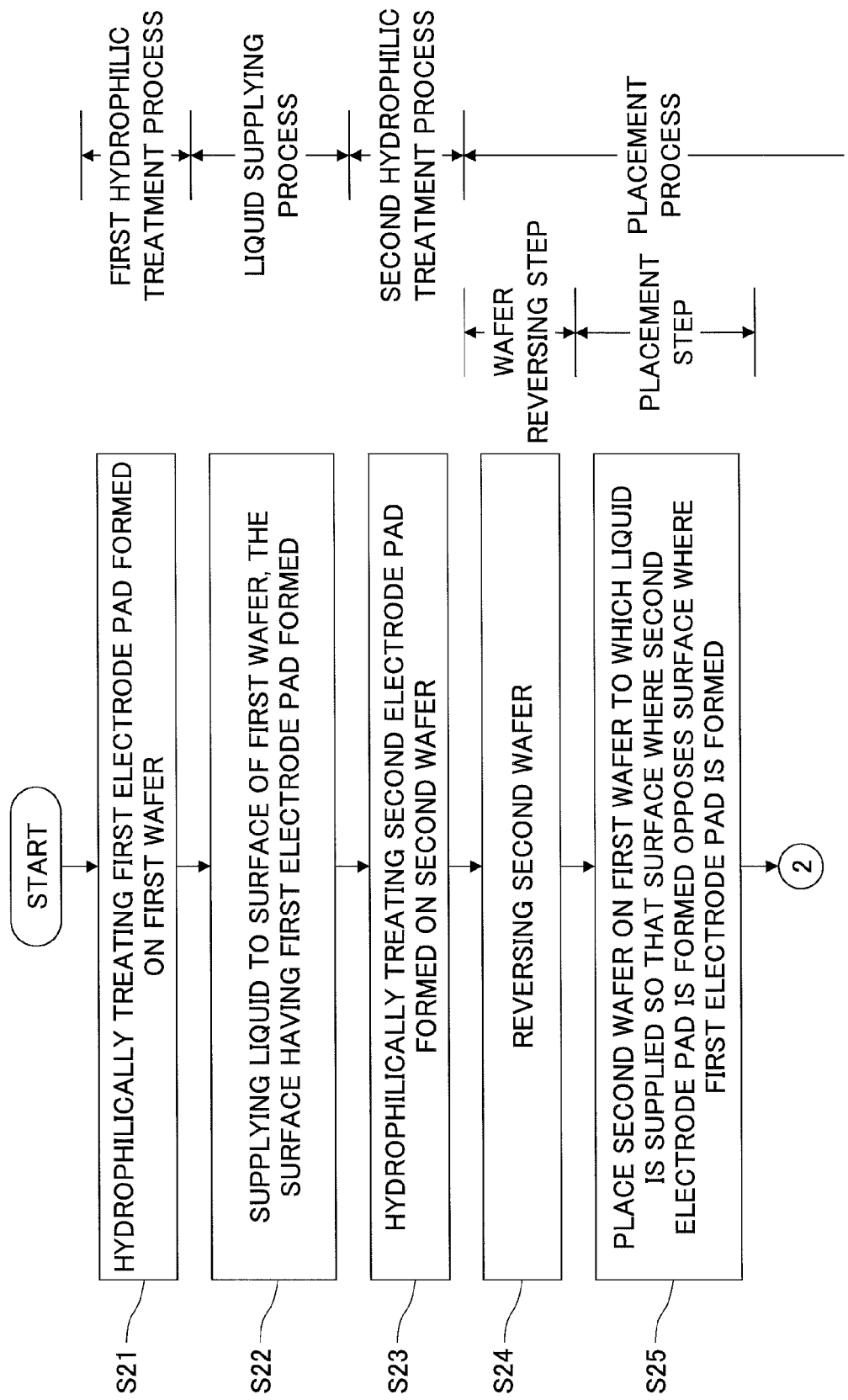

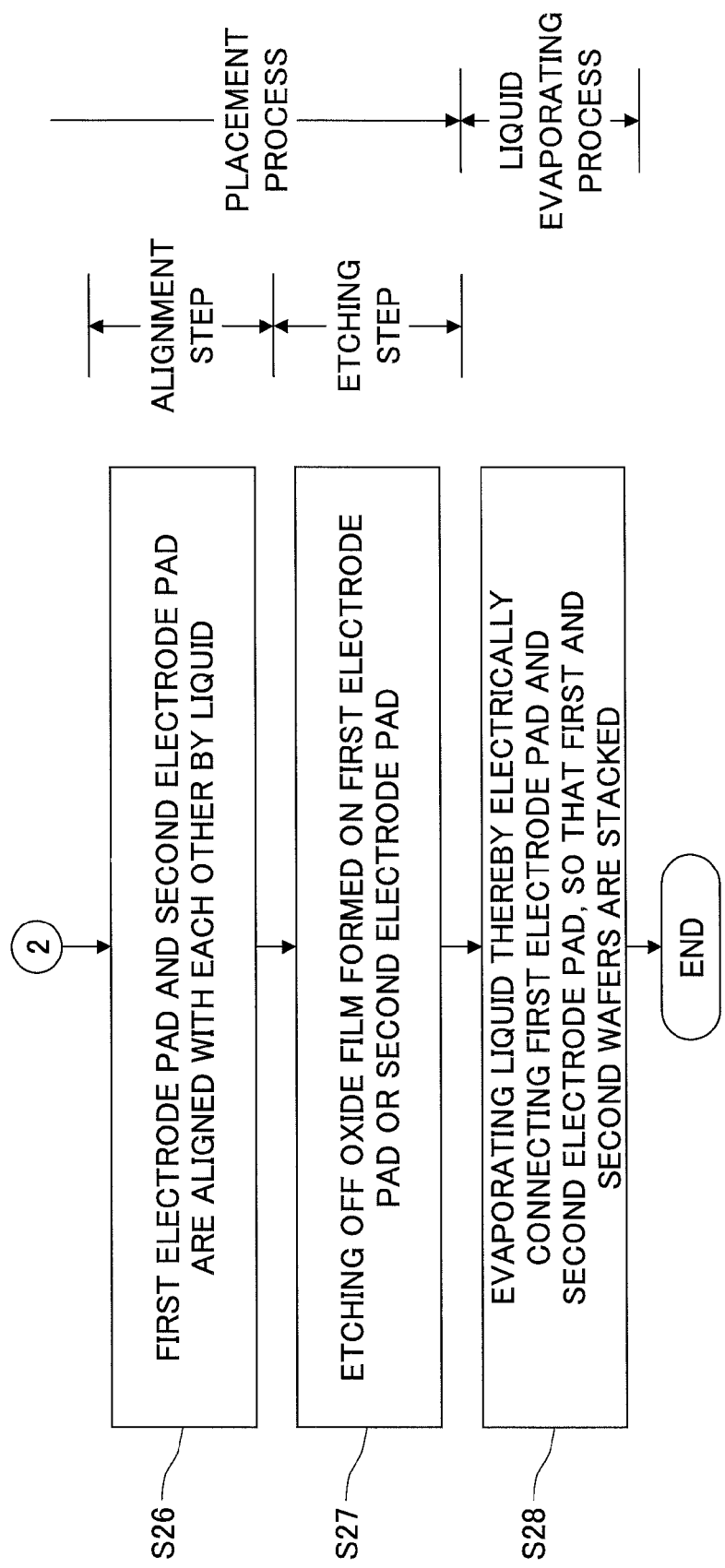

FIG.9A
(a)
(b)
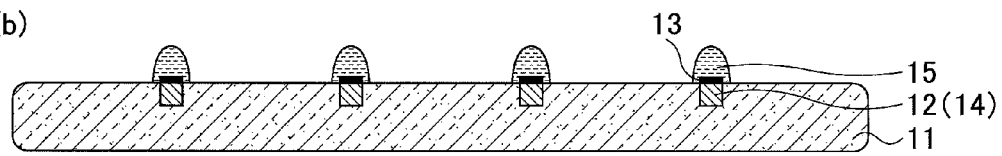
(c)
(d)
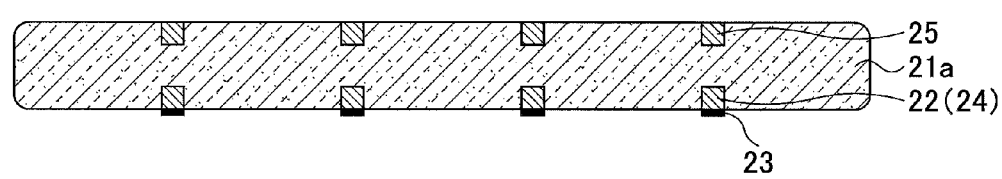

FIG.9B
(e)
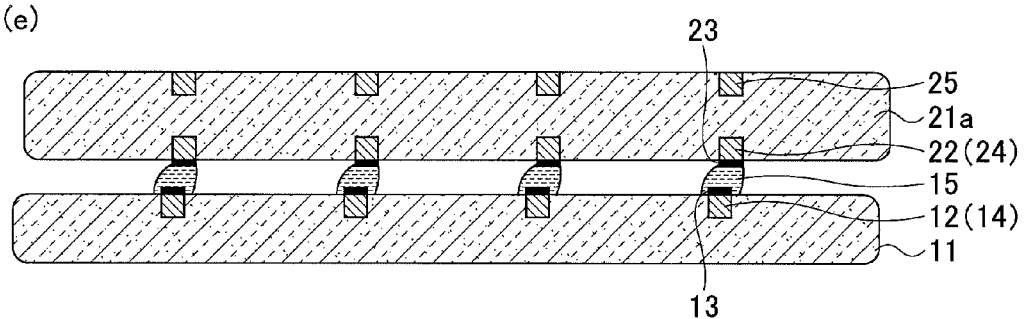
(f)
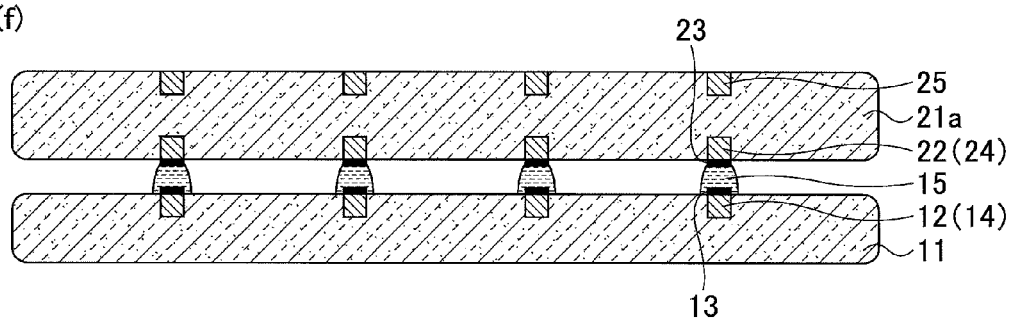
(g)
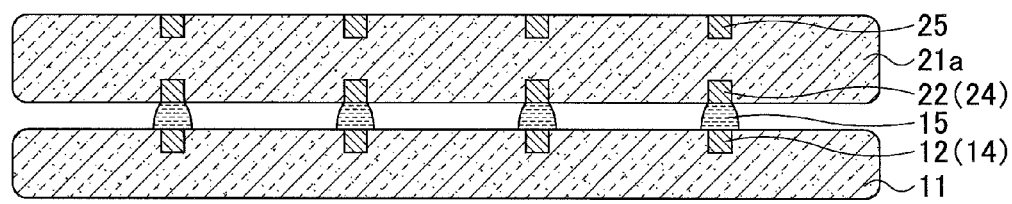
(h)
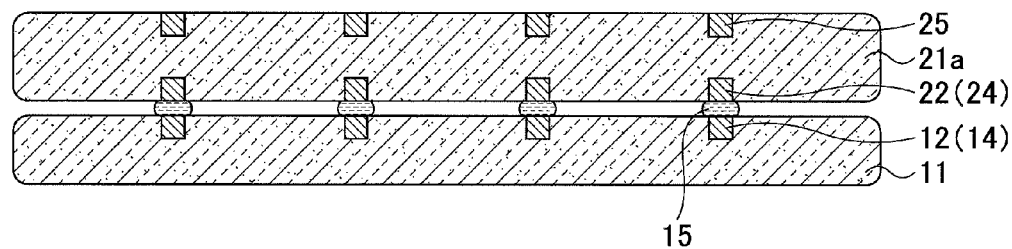

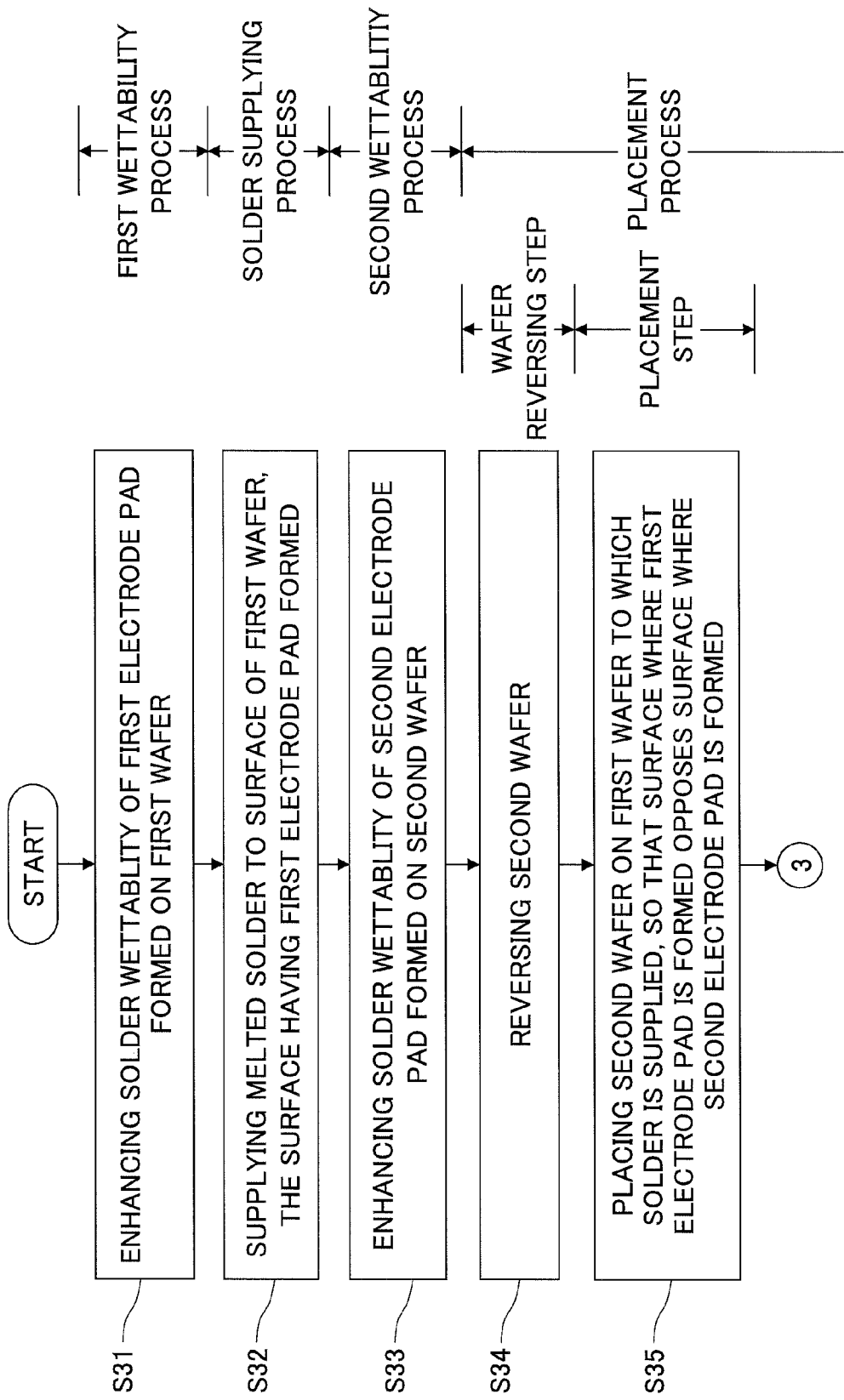

FIG.11A
(a)
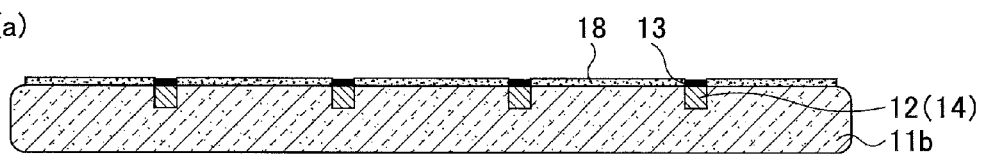
(b)
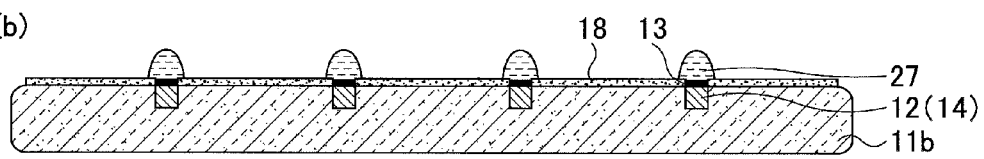
(c)
(d)
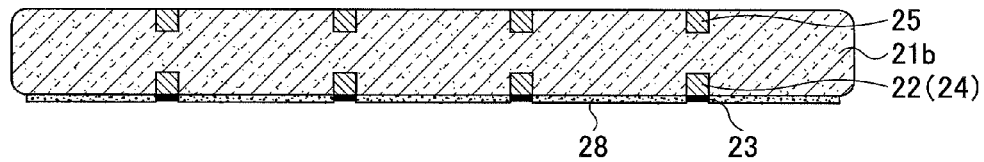

METHOD OF MANUFACTURING SEMICONDUCTOR DEVICE

TECHNICAL FIELD

The present invention relates to a method of manufacturing a semiconductor device formed by stacking substrates.

BACKGROUND ART

Along with advancements in miniaturization, faster operation, and a higher degree of integration of semiconductor devices, electrode pads that are provided on a substrate, where the semiconductor devices are formed in order to electrically connect the semiconductor devices to an exterior circuit, can be further reduced in size.

Incidentally, there is a highly integrated semiconductor device formed by stacking plural substrates having miniaturized, high speed, and highly integrated semiconductor elements therein.

In such a semiconductor device composed of plural substrates where the semiconductor elements are formed, the stacking structure must be formed after the electrode pads of the substrates to be stacked are aligned with a high degree of accuracy in order to assure electrically connecting the electrode pads, even when the electrode pads are further reduced in size. There have been disclosed several manufacturing methods of manufacturing the semiconductor device, which includes a method of aligning the substrates and a method of forming the stacking structure.

For example, Patent Document 1 discloses a method of applying an adhesive between the substrates, optically detecting patterns formed in the substrates, tentatively aligning the substrates, verifying positions of the substrate by X-ray fluoroscopy, adjusting the positions of the substrate in accordance with information regarding the positions, and then applying and hardening the adhesive.

In addition, Patent Document 2 discloses a method employing a substrate holding surface of the substrate holder, the surface being divided into plural holding areas, which are capable of independently controlling a suction force that attracts the substrate and/or a pressing force that presses one of the substrates onto the other in each of the holding areas.

Patent Document 1: Japanese Patent Application Laid-Open Publication No. 2009-49051.
Patent Document 2: Japanese Patent Application Laid-Open Publication No. 2005-302858.

SUMMARY OF INVENTION

Problems to be Solved by the Invention

In the method of manufacturing the semiconductor device having a stacking structure mentioned above, there exist the following problems when the electrode pads of the semiconductor devices are aligned with a high degree of accuracy.

In order to assure electrically connecting the electrode pad of one of the substrates with the electrode pad of the other one of the substrates, the substrates need to be stacked and aligned with a high degree of accuracy. To this end, a method is employed where alignment marks formed in the substrates are observed by using a charge-coupled device (CCD) camera provided in an aligning apparatus thereby aligning the substrate.

However, the method disclosed in Patent Document 1 may require a mechanism that employs X-ray fluoroscopy thereby verifying the positions of the substrates, in addition to a detection mechanism such as the CCD camera that optically detects the patterns in the substrate.

In addition, the method disclosed in Patent Document 2 may require a mechanism that independently controls the pressing force, in addition to the detection mechanism such as the CCD camera that optically detects the patterns in the substrate.

The present invention has been made in view of the above, and provides a method of manufacturing a semiconductor device, the method being capable of aligning substrates with a high degree of accuracy without employing a complex mechanism when the substrates are stacked and thus electrode pads that are reduced in size and/or narrow-pitched are electrically connected, thereby assuring electrically connecting the electrode pads.

Means of Solving the Problems

According to a first aspect of the present invention, there is provided a method of manufacturing a semiconductor device, wherein a first substrate where first electrode pads are formed and a second substrate where second electrodes are formed are stacked and the first electrode pads and the corresponding second electrode pads are electrically connected thereby forming the semiconductor device. The method includes steps of performing a first hydrophilic treatment with respect to the first electrode pads; supplying liquid to a surface where the first electrode pads are formed in the first substrate; and placing the second substrate on the first substrate to which the liquid is supplied so that the surface where the first electrode pads are formed opposes a surface where the second electrode pads are formed, thereby aligning the first electrode pads and the second electrode pads by use of the liquid that gathers in the first electrode pads that have been subject to the first hydrophilic treatment.

According to a second aspect of the present invention, there is provided a method of manufacturing a semiconductor device, wherein a first substrate where first electrode pads are formed and a second substrate where second electrode pads are formed are stacked and the first electrode pads and the corresponding second electrode pads are electrically connected thereby forming the semiconductor device. The method includes steps of performing a first wettability treatment that enhances solder wettability in the first electrode pads; supplying melted solder to a surface where the first electrode pads are formed in the first substrate; and placing the second substrate on the first substrate to which the melted solder is supplied so that the surface where the first electrode pads are formed opposes a surface where the second electrode pads are formed, thereby aligning the first electrode pads and the second electrode pads by use of the melted solder that gathers in the first electrode pads that have been subject to the first hydrophilic treatment.

BRIEF DESCRIPTION OF THE DRAWINGS

FIG. 1A is a flowchart for explaining procedures in corresponding processes of a method of manufacturing a semiconductor device, according to a first embodiment.

FIG. 1B is a flowchart for explaining procedures in corresponding processes of the method of manufacturing the semiconductor device, according to the first embodiment, following FIG. 1A.

FIG. 2A schematically illustrates cross-sectional views of substrate structures in corresponding processes of the method of manufacturing the semiconductor device, according to the first embodiment.

FIG. 8A is a flowchart for explaining procedures in corresponding processes of a method of manufacturing a semiconductor device, according to a second embodiment.

FIG. 8B is a flowchart for explaining procedures in corresponding processes of the method of manufacturing the semiconductor device, according to the second embodiment, following FIG. 8A.

FIG. 9A schematically illustrates cross-sectional views of substrate structures in corresponding processes of the method of manufacturing the semiconductor device, according to the second embodiment.

FIG. 9B schematically illustrates cross-sectional views of the substrate structures in corresponding processes of the method of manufacturing the semiconductor device, according to the second embodiment, following FIG. 9A.

FIG. 10A is a flowchart for explaining procedures in corresponding processes of a method of manufacturing a semiconductor device, according to a third embodiment.

FIG. 11A schematically illustrates cross-sectional views of substrate structures in corresponding processes of the method of manufacturing the semiconductor device, according to the third embodiment.

MODE(S) FOR CARRYING OUT THE INVENTION

According to an embodiment of the present invention, there is provided a method of manufacturing a semiconductor device where electrodes are electrically connected and substrates are stacked thereby forming the semiconductor device. The method is capable of aligning the substrates with a high degree of accuracy without employing a complex mechanism when the substrates are stacked and thus electrode pads that are reduced in size and/or narrow-pitched are electrically connected, thereby assuring electrically connecting the electrode pads.

First Embodiment

First, a method of manufacturing a semiconductor device according to a first embodiment of the present invention is explained, with reference to FIGS. 1A through 2B.

Figure 2B:
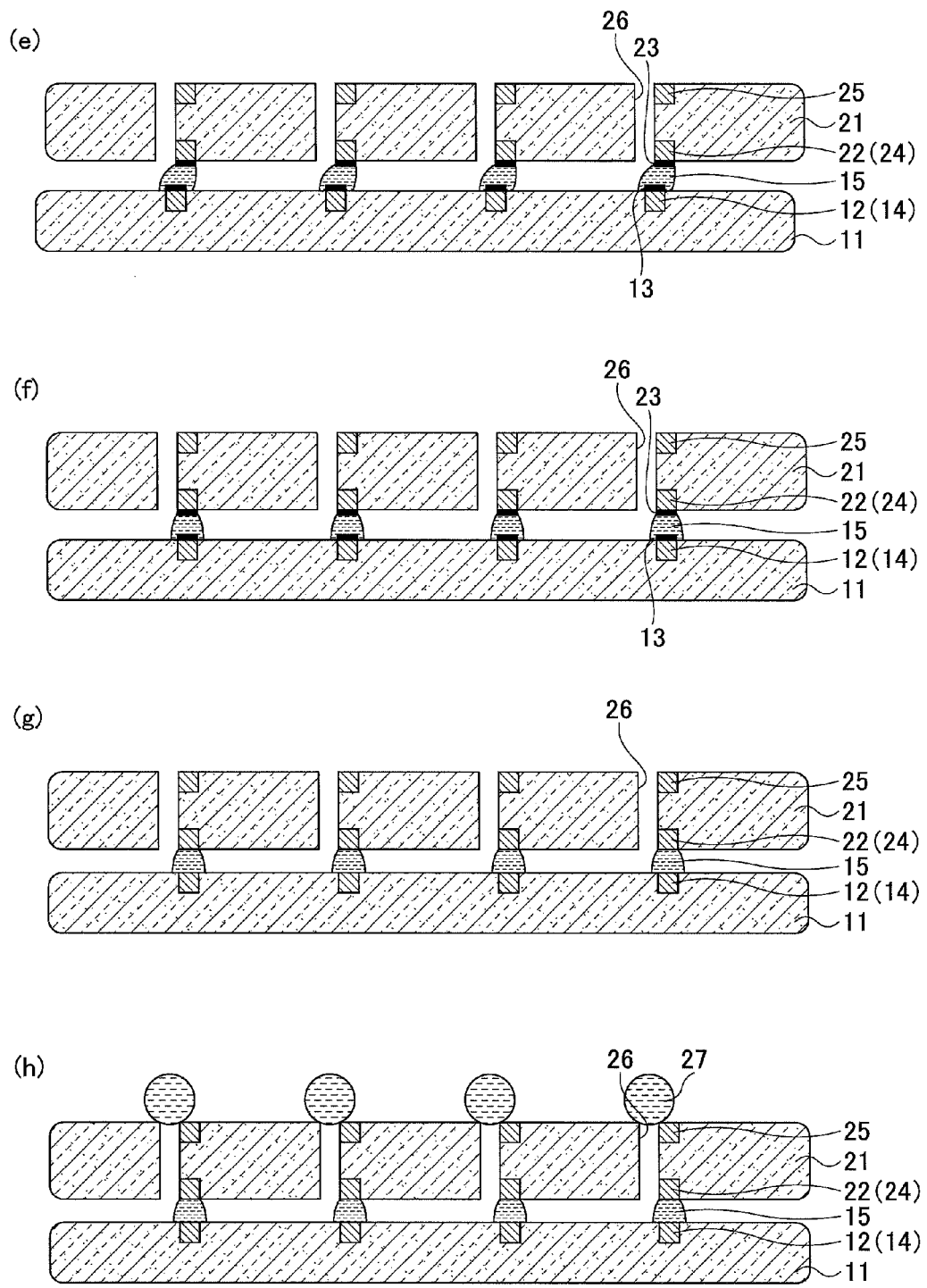
FIG. 2B schematically illustrates cross-sectional views of the substrate structures in corresponding processes of the method of manufacturing the semiconductor device, according to the first embodiment, following FIG. 2A.
Figure 2C:
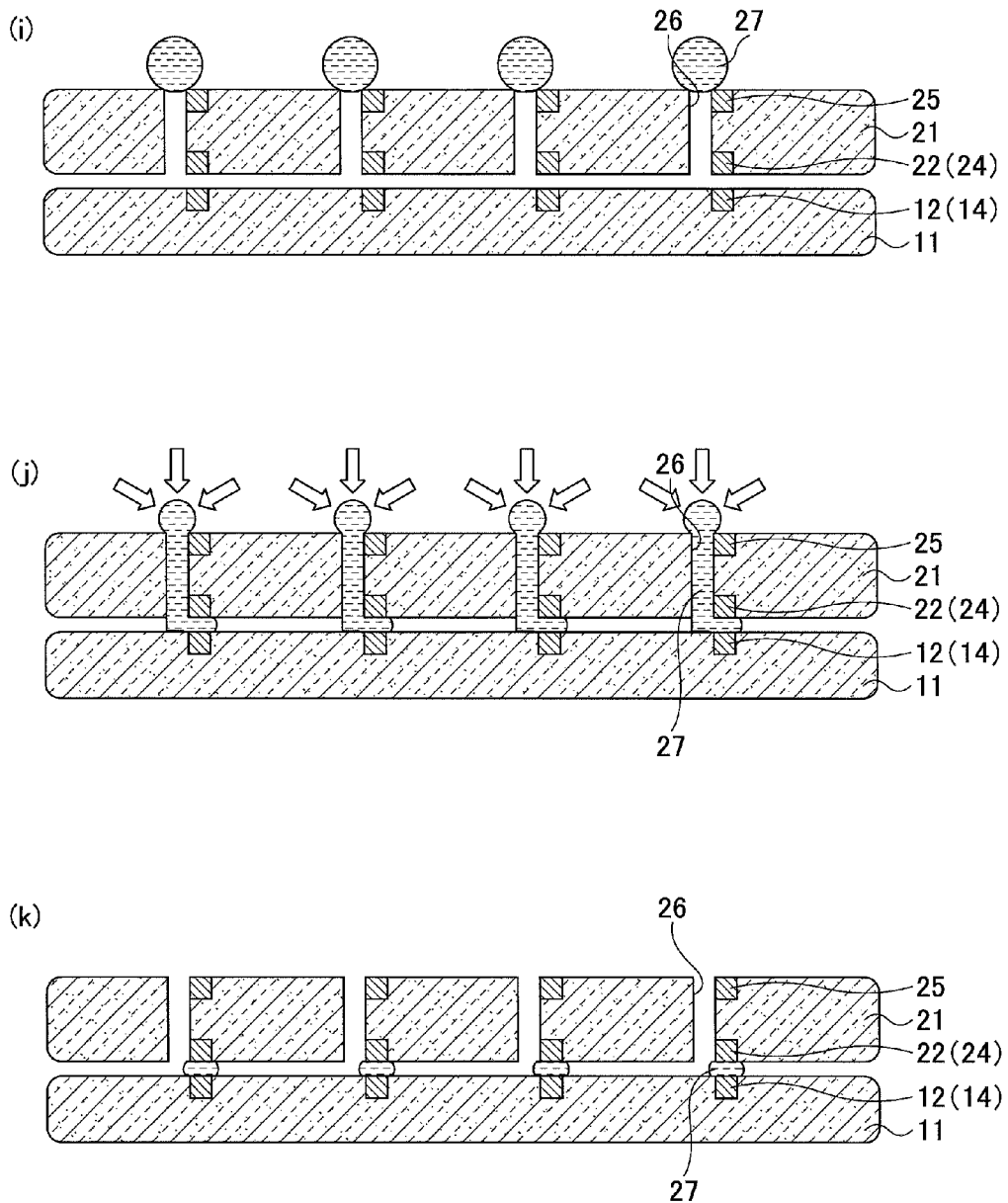
FIG. 2C schematically illustrates cross-sectional views of the substrate structures in corresponding processes of the method of manufacturing the semiconductor device, according to the first embodiment, following FIG. 2B.

FIGS. 1A and 1B are flowcharts for explaining procedures in corresponding processes of the method of manufacturing a semiconductor device according to this embodiment. FIGS. 2A through 2C are cross-sectional views that schematically illustrate the corresponding step of the stacking process of the method of manufacturing a semiconductor device according to this embodiment.

A method of manufacturing a semiconductor device according to this embodiment includes a first hydrophilic treatment process (S11), a liquid supplying process (S12), a second hydrophilic treatment process (S13), placement processes (S14 through S17), solder supplying processes (S18 and S19), and a solder hardening process (S20). The placement processes includes a substrate reversing step (S14), a placement step (S15), an alignment step (S16), and an etching step (S17). The solder supplying process includes a supplying step (S18) and a solder flow-in step (S19).

First, the first hydrophilic process is carried out (S11 of FIG. 1A). In this process, a first wafer 11 where first electrode pads 12 are formed is prepared as shown in FIG. 2A(a), and a hydrophilic treatment is carried out with respect to the first electrode pads 12. Surfaces of the first electrode pads 12 that have gone through the hydrophilic process are represented by reference symbols 13. Incidentally, the first electrode pads 12 are electrically connected to an electric circuit (not shown) or the like formed in the first wafer 11.

The hydrophilic treatment in the first hydrophilic process may be carried out by applying a photocatalyst on the surface of the first wafer 11 and then selectively irradiating ultraviolet light through a predetermined mask.

In addition, in this embodiment, a hydrophobic treatment is carried out with respect to areas except for the first electrode pads 12 in the first wafer 11. The hydrophobic treatment may be carried out by selectively applying a water repellent agent such as an organic silicon compound. However, the hydrophobic treatment to the areas except for the first electrodes pads 12 may not be carried out in other embodiments.

Incidentally, first dummy pads 14 that are not electrically connected may be formed separately from the first electrode pads 12 in the first wafer 11. The first dummy pads 14 are not electrically connected to the electric circuit or the like formed in the first wafer 11, and provided in order to align the first wafer 11 and a second wafer 21. The first dummy pads 14 may be formed, for example, in a circumferential area of the first wafer 11. When the first dummy pads 14 are formed in the first wafer 11, the hydrophilic treatment is carried out with respect to the first dummy pads 14.

Next, the liquid supplying process is carried out to supply liquid to the first wafer 11 where the surfaces 13 of the first electrode pads 12 have been hydrophilically treated and the areas except for the first electrode pads 12 have been hydrophobically treated (S12 of FIG. 1A). Specifically, the liquid is supplied to the surfaces 13 of the first electrode pads 12, as shown in FIG. 2A(a). The liquid may be supplied by a supplying method such as applying, spraying, or ejecting the liquid. In the example shown in FIG. 2A(b), the supplied liquid remains in the form of a droplet 15 on and around the surfaces 13 of the electrode pads 12.

The supplied liquid (or the droplet 15) may have electrical conductivity. In addition, the liquid having a hydrophilic property, for example, a liquid containing water may be used when the surfaces 13 of the first electrode pads 12 is hydrophilically treated and the areas except for the electrode pads 12 are hydrophobically treated.

In addition, the liquid is not necessarily supplied directly to the surfaces 13 that have gone through the hydrophilic treatment. Even when the liquid is supplied to an entire surface of the first wafer 11 thereby creating a liquid layer, the liquid moves from the hydrophobically treated areas to the hydrophilically treated surfaces 13, and thus the droplets 15 are created. Alternatively, the droplets 15 may be selectively created by use of an ink-jet printing technology, which is explained later.

In addition, when the first dummy pads 14 are formed on the first wafer 11, the liquid is supplied to the first dummy pads 14, thereby creating the droplets 15.

Next, the second hydrophilic process is carried out (S13 of FIG. 1A). In this process, the second wafer 21 where second electrode pads 22 are formed as shown in FIG. 2A(c) is prepared, and the hydrophilic process is carried out with respect to the second electrode pads 22. Surfaces of the second electrode pads 22 that have gone through the hydrophilic process are represented by reference symbols 23. Incidentally, the second electrode pads 22 are electrically connected to an electric circuit (not shown) or the like formed in the second wafer 21. In addition, the second electrode pads 22 are formed in advance in order to be connected to the corresponding first electrode pads 12 of the first wafer 11.

The hydrophilic treatment in the second hydrophilic process may be carried out by, for example, applying a photocatalyst and then selectively irradiating ultra-violet light through a predetermined mask.

In addition, in this embodiment, a hydrophobic treatment is carried out with respect to areas except for the second electrode pads 22 in the second wafer 21. The hydrophobic treatment may be carried out by selectively applying a water repellent agent such as an organic silicon compound. However, the hydrophobic treatment to the areas except for the second electrodes pads 22 may not be carried out in other embodiments.

Incidentally, second dummy pads 24 that are not electrically connected may be formed separately from the second electrode pads 22 also in the second wafer 21. The second dummy pads 24 are not electrically connected to the electric circuit or the like formed in the second wafer 21, and provided in order to align the first wafer 11 and the second wafer 21. The second dummy pads 24 may be formed, for example, in a circumferential area of the second wafer 21. When the second dummy pads 24 are formed in the second wafer 21, the hydrophilic treatment is carried out with respect to the second dummy pads 24.

In addition, the second wafer 21 is provided with third electrode pads 25 on a surface opposing a surface where the second electrode pads 11 are formed, as shown in FIG. 2A(c). Moreover, through-holes 26 are formed from the surface where the second electrode pads 22 are formed through the surface where the third electrode pads 25 are formed. The through-holes 26 have openings to be electrically connected to the second electrode pads 22 on the surface where the second electrode pads 22 are formed in the second wafer 21.

Next, the placement processes is carried out (S14 through S17). In the placement processes in this embodiment, the substrate reversing step that vertically reverses the second wafer 21 (S14 of FIG. 1A), the placement step that places the second wafer 21 on the first wafer 11 where the droplets 15 are created (S15 of FIG. 1A), the alignment step that aligns the first electrode pads 12 and the second electrode pads 22 (S16 of FIG. 1B), and the etching step (S17 of FIG. 1B) are carried out in this order.

In the substrate reversing step, the second wafer 21 of which second electrode pads 22 have been hydrophilically treated is vertically reversed as shown in FIG. 2A(d). A method of vertically reversing the second wafer 21 is explained later.

Next, in the placement step, the second wafer 21 is placed on the first wafer 11 so that the surface where the second electrode pads 22 are formed in the second wafer 21 opposes the surface where the first electrode pads 21 are formed and the droplets 15 that are created on or around the surfaces 13 of the first electrode pads 12 in the first wafer 11, as shown in FIG. 2B(e).

Incidentally, the placement step may be carried out under a reduced pressure environment. In this case, the subsequent steps until the supplying step are carried out under the reduced pressure environment.

In addition, the second wafer 21 may be placed on the first wafer 11 after alignment is carried out by an alignment apparatus having an alignment mechanism or the like. A method of aligning the second wafer 21 on the first wafer 11 using the alignment apparatus having the alignment mechanism is explained later. However, the alignment is not necessarily carried out with a high degree of accuracy, as described later. Moreover, when carrying out the placement, application of pressure onto the second wafer 21 is not necessary in either direction.

In addition, when the first dummy pads 14 mentioned above are formed in the first wafer 11 and the second dummy pads 24 mentioned above are formed in the second wafer 21, the first dummy pads 14 come in contact with the corresponding second dummy pads 24 via the droplets 15.

In the alignment step (S16 of FIG. 1B) as shown in FIG. 2B(f), the second wafer 21 placed on the first wafer 11 is self-aligned with respect to the first wafer 11. This is because the second wafer 21 can move relative to the first wafer 11 in connection with that the droplets 15 move to come in contact with the corresponding hydrophilic surfaces 13 of the first electrode pads 12 in the first wafer 11 and the corresponding hydrophilic surfaces 23 of the second electrode pad 22 in the second wafer 21, and because the droplets 15 themselves remain between the corresponding surfaces 13 and the corresponding surfaces 23, without spreading, due to surface tension of the droplets 15. From a viewpoint of use of the surface tension, it is preferable that the hydrophilic liquid is used, and the first electrode pads 12 and the second electrode pads 22 are hydrophilically treated.

In addition, when the first dummy pads 14 mentioned above are formed in the first wafer 11 and the second dummy pads 24 mentioned above are formed in the second wafer 21, the first dummy pads 14 are aligned with the corresponding second dummy pads 24 via the corresponding droplets 15.

In the first wafer 11 and the second wafer 21 that are aligned with each other in the alignment step (S16), the surfaces of the first electrode pads 12 may be reduced and/or etched by the droplets 15, as shown in FIG. 2B(g) (S17). Namely, while oxide films or coated layers of contaminants may be formed on the surfaces of the first electrode pads 12, such oxide films or the coated layers can be removed through reduction and/or etching. Alternatively, when oxide films or coated layers of contaminants may be formed on the surfaces of the second electrode pads 22, such oxide films or the coated layers can be removed. Incidentally, FIG. 2B(g) illustrates an example where the hydrophilic surfaces 13 of the first electrode pads 12 and the hydrophilic surfaces 23 of the second electrode pads 22 are etched.

As stated above, the droplets 15 preferably have an etching capability with respect to the oxide film and the like formed on the electrode pads 12, 22. By etching the oxide film and the like formed on the electrode pads 12, 22, electrical connection between the first electrode pads 12 and the second electrode pads 22, which is realized by using solder (described later), can be ensured.

Next, the solder supplying processes that flows melted solder into the through-holes 26 formed in the second wafer 21 are carried out (S18 and S19). Specifically, the solder supplying processes are composed of the solder supplying step (S18) and the solder flow-in step (S19).

First, an environment of the first wafer 11 and the second wafer 21 placed on the first wafer 11 is maintained at a reduced pressure in this embodiment. For example, the placement step (S15) and the alignment step (S16) are carried out in a chamber (not shown) that is coupled to an evacuation apparatus (not shown) that evacuates the chamber to a reduced pressure. After the alignment step the chamber is evacuated to a reduced pressure. In addition, a wafer receiving part of the chamber is preferably provided with a heating apparatus such as a heater, by which the first wafer 11 and the second wafer 21 are heated to a predetermined temperature in this embodiment.

Incidentally, the droplets 15 between the first electrode pads 12 and the second electrode pads 22 are evaporated under the reduced pressure environment, as shown in FIG. 2C(i).

Next, in the solder supplying step, melted solder 27 is supplied onto the surface of the second wafer 21, the surface opposing the first wafer 11, as shown in FIG. 2B(h). Specifically, the melted solder 27 is supplied to and around the openings of the through-holes 26 on the surface opposing the first wafer 11.

Alternatively, a wettable treatment may be carried out in order to enhance wettability of the melted solder 27 with respect to the surfaces of the third electrode pads 25 formed on the surface opposing the surface where the second electrode pads 22 are formed in the second wafer 21, so that the melted solder 27 can selectively gather on and around the through-holes 26. Incidentally, while FIGS. 2A and 2B illustrate an example where the second electrode pads 22 and the third electrode pads 25 are formed on one side of the corresponding through-holes 26, the second electrode pads 22 and the third electrode pads 25 may also be formed on both sides of the corresponding through-holes 26. Alternatively, the second electrode pads 22 and the third electrode pads 25 may be formed to surround the openings of the through-holes 26.

Next, in the flow-in step (S19), the melted solder 27 is caused to flow into the through-holes 26. Specifically, the environment of the first wafer 11 and the second wafer 21 is pressurized to an atmospheric pressure. Here, the through-holes 26 are blocked by the melted solder 27, and the melted solder 27 is sucked into the through-holes 26, as shown in FIG. 2C(j), because the insides of the through-holes 26 are kept at a reduced pressure.

Incidentally, the solder supplying step (S18) may be carried out in a normal pressure environment. In this case, the droplets 15 may be evaporated by heating the first wafer 11 and the second wafer 21, and the melted solder 27 may be pushed into the through-holes 26 by applying pressure.

Next, the solder hardening process (S20) is carried out where the solder 27 is hardened thereby bonding the first electrode pads 12 and the second electrode pads 22. Specifically, the first wafer 11 and the second wafer 21 are intentionally or naturally cooled, so that the solder 27 is hardened and remains between the first electrode pads 12 and the second electrode pads 22, thereby electrically connecting the first electrode pads 12 and the second electrode pads 22.

Figure 3:
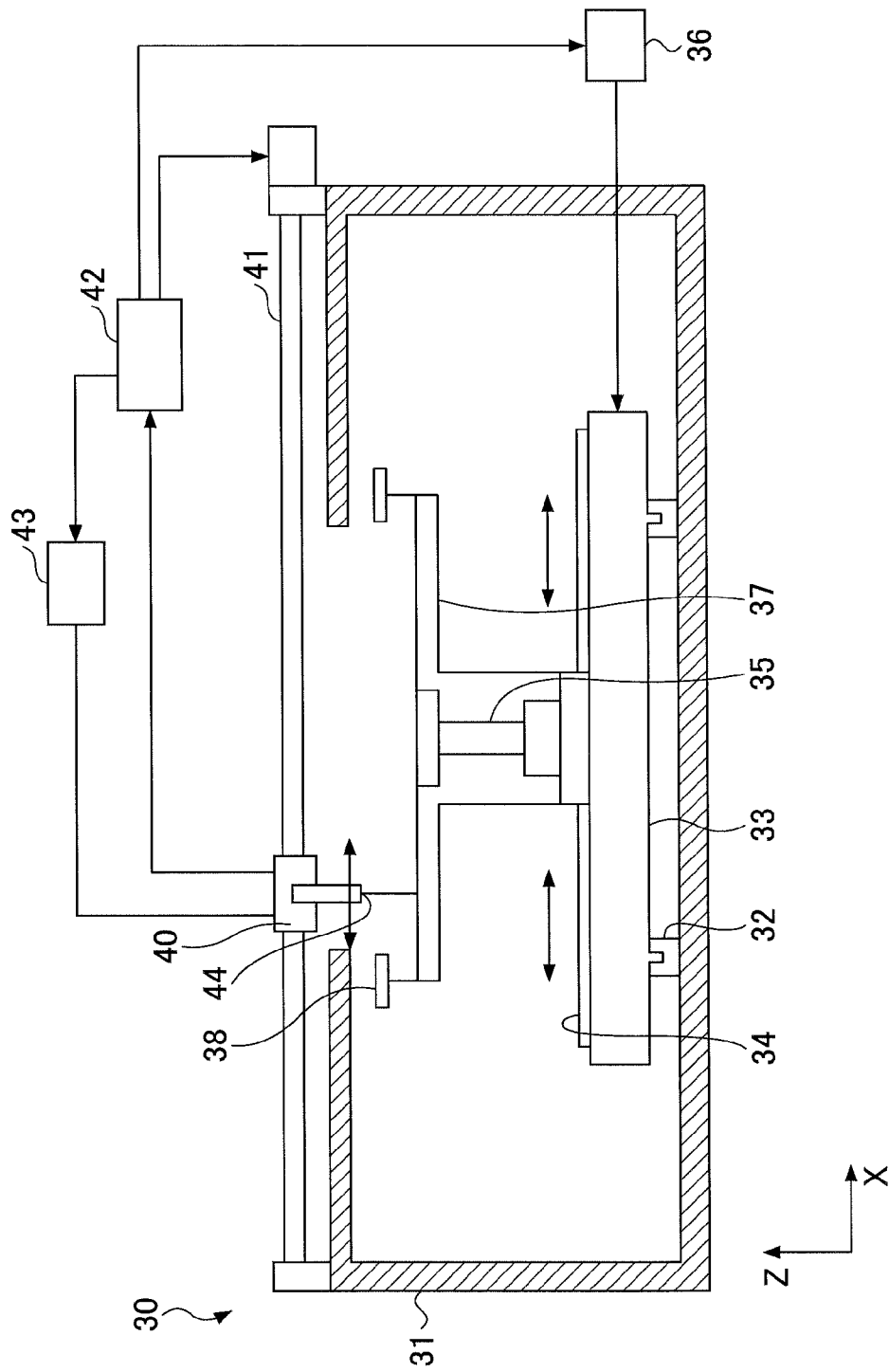
FIG. 3 is a cross-sectional view illustrating an example of a liquid applying apparatus utilizing an ink-jet printing technology.
Figure 4:
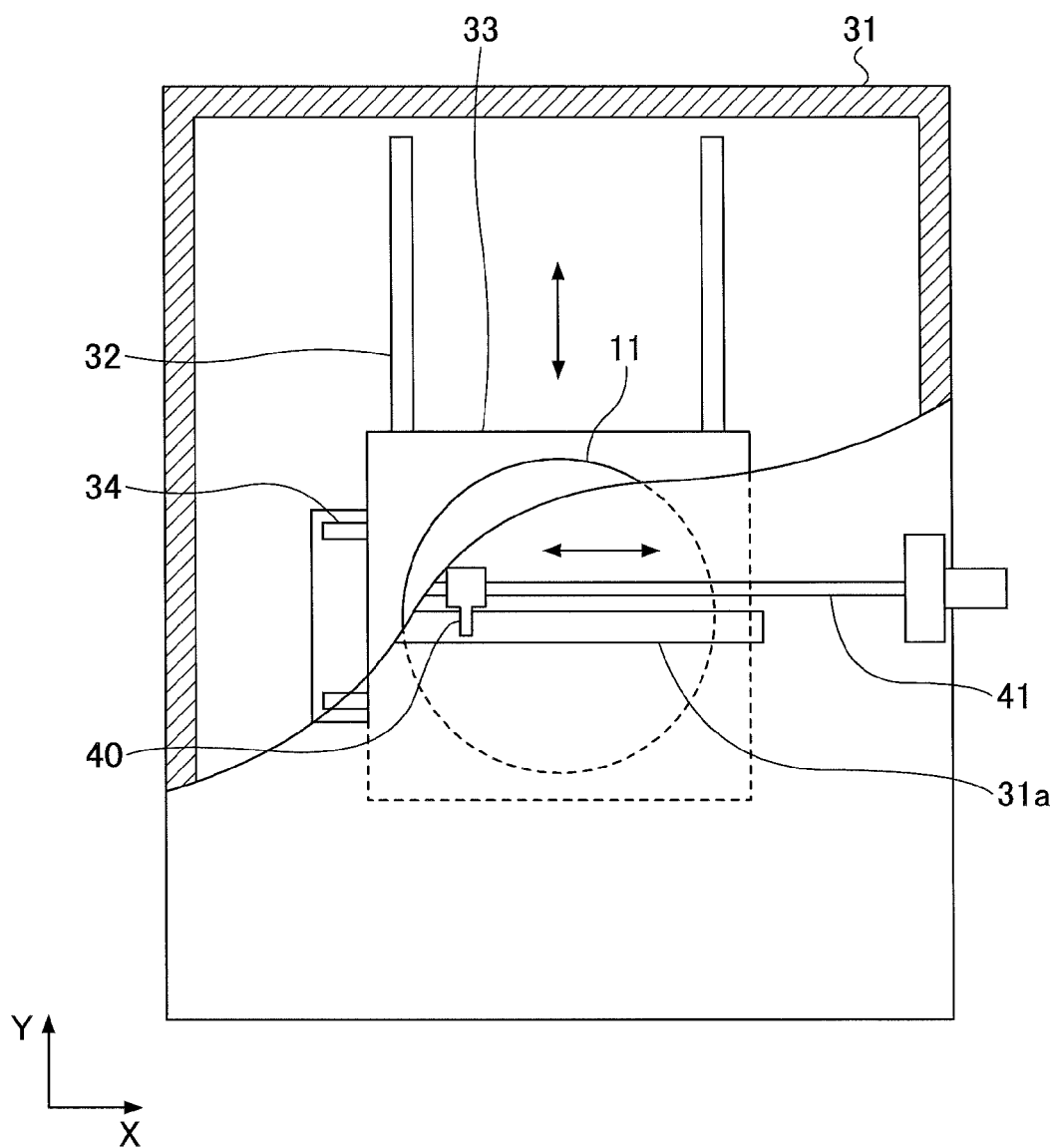
FIG. 4 is a plan view illustrating the example of the liquid applying apparatus utilizing an ink-jet printing technology.

Next, a liquid applying apparatus that applies liquid that becomes the droplet 15 in the liquid supplying process (S12), utilizing an ink-jet printing technology, is explained with reference to FIGS. 3 and 4. FIG. 3 is a cross-sectional view illustrating the liquid applying apparatus utilizing the ink-jet printing technology, and FIG. 4 is a plan view of the liquid applying apparatus of FIG. 3. As shown in these drawings, the liquid applying apparatus includes a body 30, a liquid supplying nozzle 40, and a controlling part 42.

The body 30 includes a chassis 31 that is provided at its bottom surface with a base part 33 that is movable from one side to the other side in the chassis 31 via a rail 32 extending along a Y direction. The base part 33 is provided on its upper surface with a substrate holding part 35 configured to be movable via a rail 34 extending along an X direction. The substrate holding part 35 is configured so that the wafer 21 is horizontally held from its reverse side by suction with an upper end part of the substrate holding part 35. With these configurations, the wafer 11 held by the substrate holding part 35 can change the positions in the X direction and the Y direction in the chassis 31 via the substrate holding part 35 and the base part 33 by the operation of a driving mechanism 36.

A mask supporting member 37 that is configured integrally with the substrate holding part 35 and is elevated above an upper surface of the wafer 11 is provided around the substrate holding part 35. A detachable mask 38 that has a relatively large opening in the center in order to prevent the liquid from attaching to an area except for an area on which the liquid attaches is supported by an upper end of the mask supporting member 37. On one side of the mask supporting member 37 and the chassis 31, an opening (not shown) through which the wafer 11 is transferred in or out from the chassis 31 is formed.

The liquid supplying nozzle 40 is held by a linear slide mechanism 41 that is installed in an upper part of the chassis 31 along the X direction. In addition, a distal end of the liquid supplying nozzle 40 protrudes into the inside of the chassis 31 through a slit 31a (FIG. 4) formed in a ceiling part of the chassis 31. The liquid supplying nozzle 40 can be moved along the X direction by operating the linear slide mechanism 41 under control of the controlling part 42. A liquid supplying part 43 that is connected to a liquid supplying source (not shown) is connected to the liquid supplying nozzle 40, so that the liquid is supplied from the liquid supplying part 43 to the liquid supplying nozzle 40, for example, in accordance with a control signal from the controlling part 42 to the liquid supplying part 43.

The liquid supplying nozzle 40 is provided with a nozzle part 44 composed of an ink-jet nozzle having plural discharging holes. The discharging holes of the nozzle part 44 may be arranged in the form of a rectangle or a line so that the liquid is discharged, for example, at 180 dots per inch (dpi) with respect to one of the plural electrode pads formed on the surface of the wafer 11. The ink-jet nozzle may be of a share type where piezo elements are arranged on both sides of a liquid passage thereby to oppose each other and press out the liquid by deforming the piezo elements.

In the liquid supplying process (S12), after the first wafer 11 is sucked by the substrate holding part 35 in the liquid applying apparatus, the liquid supplying nozzle 40 is reciprocated in the X direction by the linear slide mechanism 41, while the liquid is discharged from the liquid supplying nozzle 40. In this case, when the liquid supplying nozzle 40 turns back at one end of the first wafer 11, the base part 33 is shifted toward the Y direction by a slight distance of, for example, 0.5 mm. In such a manner, the liquid supplying nozzle 40 scans over the first wafer 11 while discharging the liquid from the liquid supplying nozzle 40, and thus the liquid is supplied to an entire surface of the first wafer 11.

Figure 5:
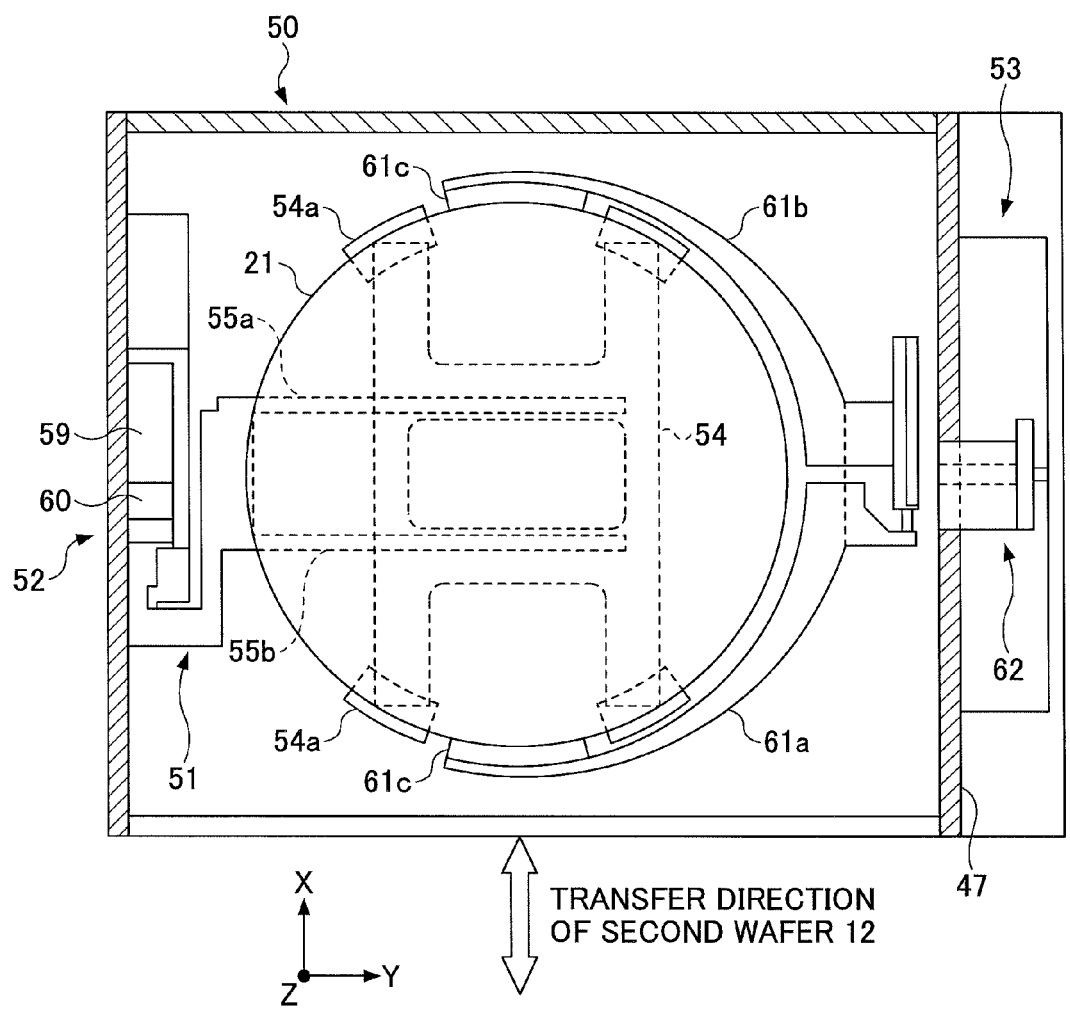
FIG. 5 is a plan view illustrating an example of a wafer reversing apparatus.

Next, a method of vertically reversing the second wafer 21 and placing the vertically reversed second wafer 21 onto the first wafer 11 in the substrate reversing step (S14 of FIG. 1A)

is explained with reference to FIG. 5 and FIG. 6. FIG. 5 is a plan view illustrating an example of a wafer reversing apparatus, and FIG. 6 is a side view of the wafer reversing apparatus of FIG. 5.

A wafer reversing apparatus 50 includes a wafer relay part 51 that transfers the wafer 21 to or from a primary wafer transfer mechanism (not shown), an elevation mechanism 52 that moves the wafer relay part 51 upward or downward, and a wafer reversing mechanism 53 that grips the wafer 21 held by the wafer relay part 51 thereby to receive the wafer 21, rotates the wafer 21 thereby to reverse the wafer 21, and transfers the wafer 21 back to the wafer relay part 51.

Figure 6:
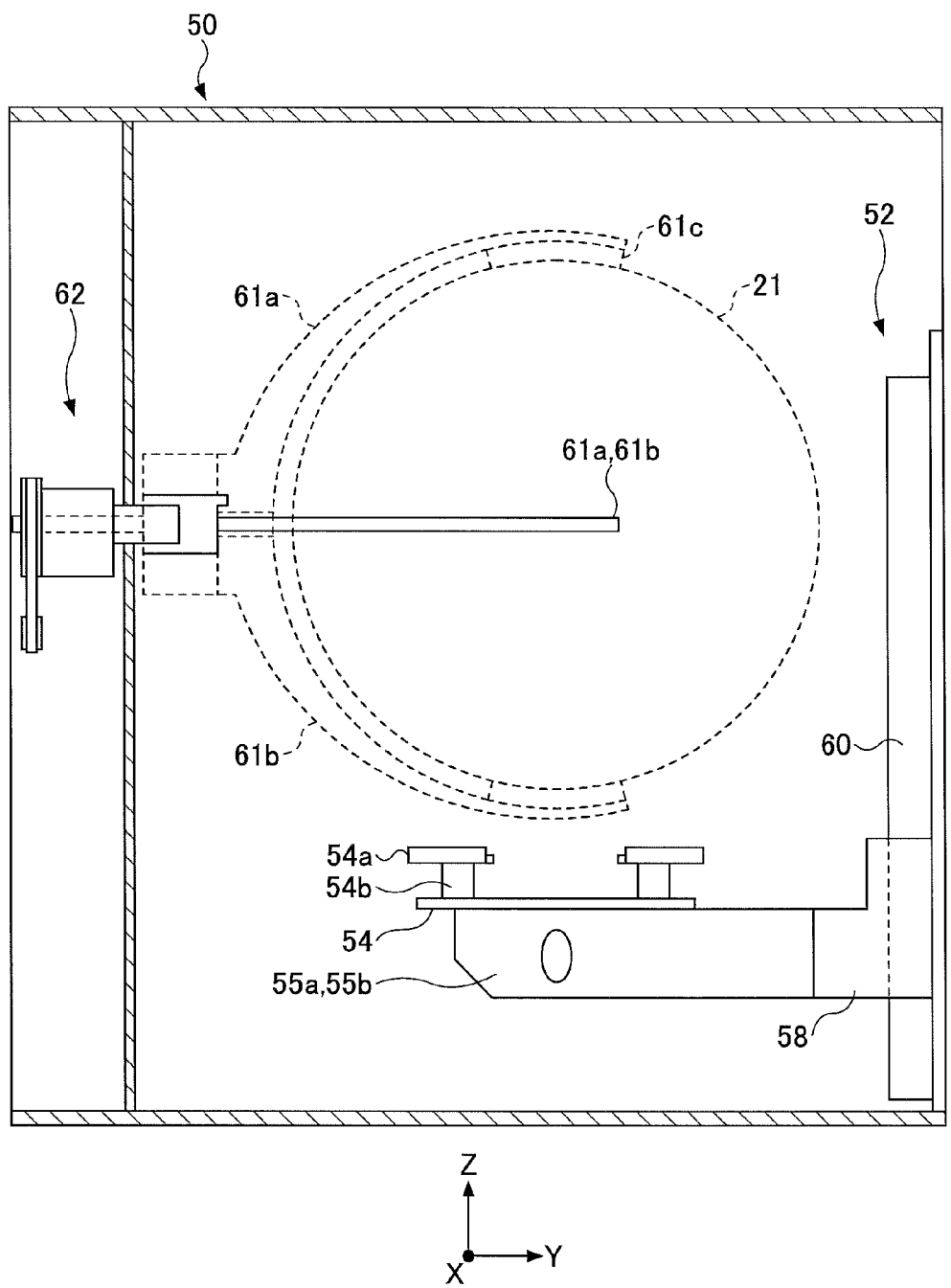
FIG. 6 is a side view illustrating the example of the wafer reversing apparatus.

As shown in FIG. 5 and FIG. 6, the wafer relay part 51 has a supporting pedestal 54 having a substantial H-shape and two supporting arms 55a, 55b that horizontally hold the supporting pedestal 54. Four leg parts 54b (FIG. 6) are arranged at corresponding four end parts of the supporting pedestal 54, and a supporting member 54a having a substantially cross-sectional shape of "L" is arranged on the four leg parts 54b. The holding member 54a supports a circumferential part of the wafer 21 by a horizontal part of the L-shape, and guides the wafer 21 supported by the horizontal part by a vertical part of the L-shape.

Referring to FIG. 6, base parts of the supporting arms 55a, 55b are fixed on a block 58 attached to the elevation mechanism 52. The block 58 is coupled with an air cylinder 59 that elongates and contracts along a Z direction, so that the block 58 is moved upward or downward along a guide 60 extending along the Z direction by the elevating movement of the air cylinder 59 (FIG. 5). Incidentally, the elevation mechanism 52 is not limited to a structure employing the air cylinder 59, but may be a mechanism that realizes the elevating movement by conveying rotational force caused by a rotating mechanism such as a motor to the block 58 by use of a pulley, a belt, or the like.

The wafer reversing mechanism 53 includes a pair of wafer gripping arms 61a, 61b that are openable and closable in the X direction. The wafer gripping arms 61a, 61b are provided at distal ends thereof with corresponding gripping members 61c having corresponding V grooves of which bottoms are along a side surface of the wafer 21. When the wafer gripping arms 61a, 61b are closed, the circumferential part of the wafer 21 is gripped by the V grooves. In addition, the wafer gripping arms 61a, 61b are coupled at base ends thereof with a rotational mechanism 62 and rotated around a horizontal axis by the rotational mechanism 62. FIG. 6 illustrates the wafer gripping arms 61a, 61b rotated around the horizontal axis 90° by the rotational mechanism 62, and the second wafer 21 that is gripped by the wafer gripping arms 61a, 61b and vertically maintained, with a dotted line.

In the wafer reversing apparatus 50 configured above, the substrate reversing step (S14 of FIG. 1A) is carried out in the following manner. First, the second wafer 21 that has gone through the second hydrophilic process (S13 of FIG. 1A) is transferred from the wafer transfer mechanism (not shown) to the wafer reversing apparatus 50, while the surface where the second electrode pads 22 are formed in the second wafer 21 is facing upward, and then received by the supporting member 54a on the supporting pedestal 54. Next, the supporting pedestal 54 that holds the second wafer 21 is elevated by the elevation mechanism 52 to the same level as the wafer gripping arms 61a, 61b that are opened. Then, the wafer gripping arms 61a, 61b are closed thereby gripping the second wafer 21.

Next, the supporting pedestal 54 and the supporting member 54a are receded downward in order not to interfere with the wafer gripping arms 61a, 61b that reverses the second wafer 21. Then, the second wafer 21 is rotated 180° by the rotational mechanism 62, which vertically reverses the second wafer 21. After this, the supporting pedestal 54 is brought upward to the level of the wafer gripping arms 61a, 61b, and the second wafer 21 is received by the supporting pedestal 54 by opening the wafer gripping arms 61a, 61b. Subsequently, the supporting pedestal 54 that supports the second wafer 21 is brought downward, and thus the second wafer 21 is transferred from the supporting pedestal 54 to the wafer transfer mechanism.

Then, the second wafer 21 that has been vertically reversed goes through the placement step (S15 of FIG. 1A).

Figure 7:
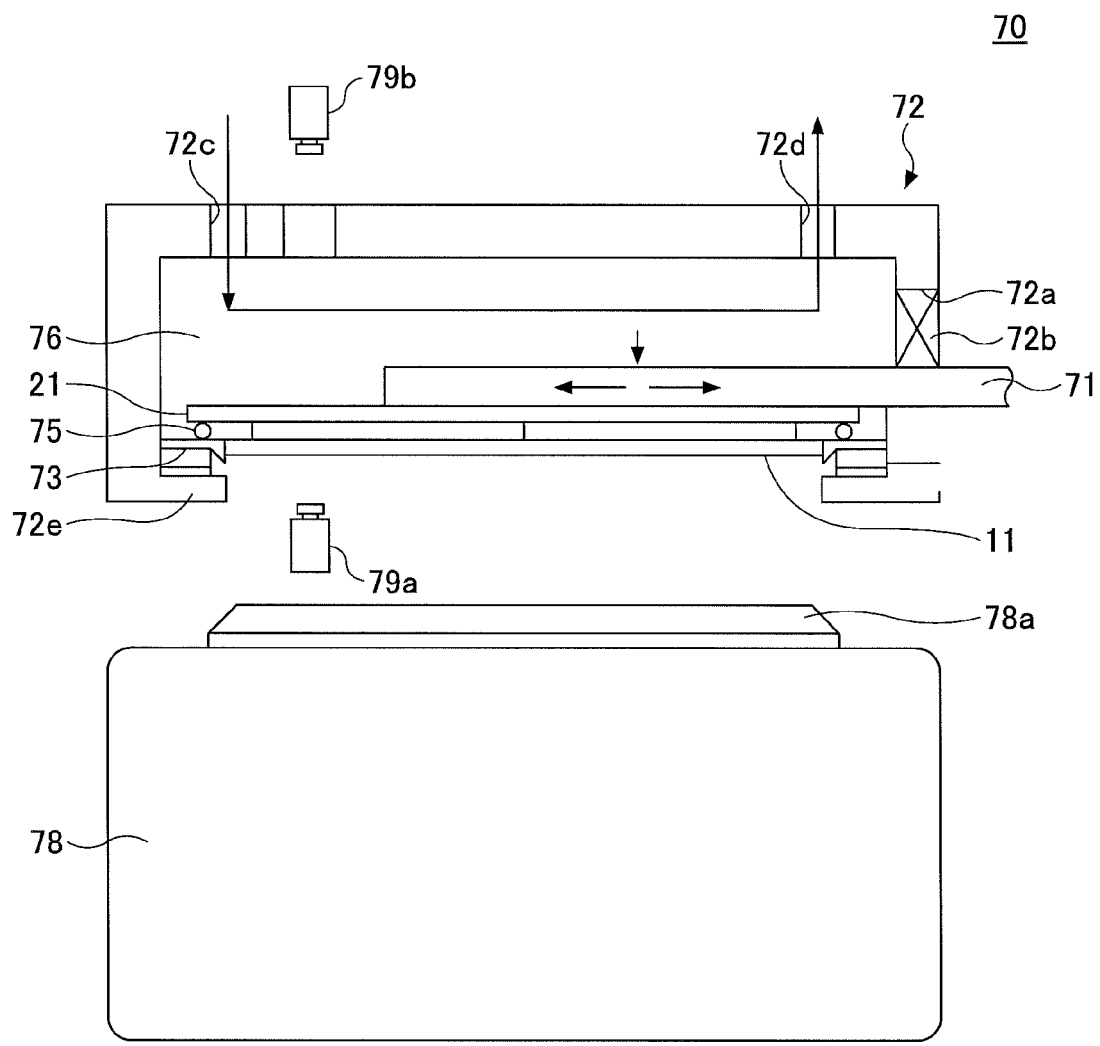
FIG. 7 is a plan view illustrating an example of an alignment apparatus.

Next, procedures of roughly aligning the first wafer 11 and the second wafer 21 by use of an alignment apparatus, and placing the second wafer 21 onto the first wafer 11 in the placement step (S15) are explained with reference to FIG. 7. FIG. 7 is a side view illustrating the alignment apparatus.

An alignment apparatus 70 includes a wafer transfer arm 71 that transfers the second wafer 21 that has been vertically reversed, a chamber 72 that the wafer transfer arm 71 can move into or out from, a position adjusting mechanism 73 that is provided in the chamber 72 and aligns the first wafer 11, alignment mechanism 79a, 79b that include a charge-coupled device (CCD) for taking an image of the dummy pads 14, 24, or the like formed in the first wafer 11 and the second wafer 21, respectively, a placement pedestal 78 on which the first wafer 11 and the second wafer 21 that are aligned with each other are placed.

The chamber 72 has a substantially cylindrical shape having an open bottom and a closed top, and is elevatable by an elevation mechanism (not shown). A transfer opening 72a through which the second wafer 21 is transferred in or out by the wafer transfer arm 71 is formed on a circumferential wall of the chamber 72. The transfer opening 72a is openable or closable by a gate valve 72b. The gate valve 72b closes the transfer opening 72a in an air-tight manner after the wafer transfer arm 71 transfers the second wafer 21 into the chamber 72, as shown in FIG. 7. A gas supplying opening 72c to which a gas supplying line (not shown) is connected and a gas evacuation opening 72d to which a gas evacuating line (not shown) is connected are formed on an upper wall of the chamber 72. With such configurations, a flow of a predetermined inert gas or a clean air from the gas supplying opening 72c to the gas evacuation opening 72d through the chamber 72 can be created. In addition, a flange 72e is provided at a bottom end of the chamber 72. The flange 72e has an opening having an inner diameter that is greater than outer diameters of the first wafer 11 and the second wafer 21.

In addition, the flange 72e of the chamber 72 is provided with a position adjustment mechanism 73 for aligning the first wafer 11. An 0-ring 75 is arranged on an upper surface of the position adjustment mechanism 73. Namely, the position adjustment mechanism 73 supports an upper surface of the second wafer 21 that has been transferred in by the wafer transfer arm 71 via the O-ring 75. In addition, when the wafer transfer arm 71 holding the second wafer 21 proceeds into the chamber 72, and then the second wafer 21 is placed onto the O-ring 75, a closed space 76 is created by the O-ring 75 above the second wafer 21.

The position adjustment mechanism 73 is provided with guide rails (not shown) respectively along the X direction, the Y direction, and a θ direction, and piezo elements (not shown) provided corresponding to the guide rails. With such configurations, the position adjustment mechanism 73 can move in the X direction, the Y direction, and the θ direction although in a slight distance, so that a position of the first wafer 11 can be adjusted. Specifically, the position adjustment mechanism 73 moves the first wafer 11 in accordance with a positional difference between the first wafer 11 and the second wafer 21 obtained by the alignment mechanism 79a, 79b, so that the first electrode pads 12 of the first wafer 11 are aligned with the corresponding second electrode pads 22 of the second wafer 21.

By using the alignment apparatus 70 configured as explained above, alignment of the first wafer 11 and the second wafer 21 is carried out, and the second wafer 21 is placed on the first wafer 11 in accordance with the following procedures.

First, the first wafer 11 that has gone through the liquid supplying process (S12) is held by the position adjustment mechanism 73 in the chamber 72. Next, the second wafer 21 that has been vertically reversed in the substrate reversing step (S14) is held (or vacuum chucked) by the wafer transfer arm 71, and transferred into the chamber 72. The wafer transfer arm 71 is stopped at a position where the center of the second wafer 21 is substantially in agreement with the center of the first wafer 11. Then, the wafer transfer arm 71 is brought downward and stopped at a position where the second wafer 21 comes in contact with the O-ring 75. The vacuum chuck of the wafer transfer arm 71 is released, so that the second wafer 21 is placed on the O-ring 75. Subsequently, the gate valve 72b is closed.

Next, the first dummy pads 14, for alignment, arranged in the circumferential part of the first wafer 11 and the second dummy pads 24, for alignment, arranged in the circumferential part of the second wafer 21 have an image of them taken, thereby obtaining corresponding X-coordinates and Y coordinates, according to which the positional difference between the first wafer 11 and the second wafer 21 is obtained. Based on the positional difference, the position of the first wafer 11 is fine adjusted by the position adjustment mechanism 73, and thus the first wafer 11 and the second wafer 21 are aligned in the X direction, the Y direction, and/or the θ direction.

Next, the chamber 72 is brought down toward the placement pedestal 78, and the first wafer 11 comes in contact with a stage 78a of the placement pedestal 78. After the position adjustment mechanism 73 releases the first wafer 11, when the chamber 72 is further brought downward, the second wafer 21 is placed on the first wafer 11.

Here, the flange 72e of the chamber 72 comes in contact with the placement pedestal 78 via the O-ring 75 or the like, so that the inside of the chamber 72 is maintained in an air-tight manner. For example, when the alignment apparatus 70 is provided with an evacuation apparatus (not shown), the subsequent solder supplying steps (S18 and S19) are carried out inside the chamber 72.

Incidentally, the aforementioned alignment apparatus is merely an example, but other alignment apparatuses of various types may be used.

According to this embodiment, when the second wafer 21 is placed on the first wafer 11, because the droplets 15 on the hydrophilically treated surfaces 13 of the first electrode pads 12 in the first wafer 11 gather between the surfaces 13 and the corresponding hydrophilically treated surfaces 23, the second wafer 21 can be self-aligned with the first wafer 11. Therefore, even when the alignment apparatus 70 is necessary for rough alignment, the need for an alignment mechanism that enables alignment with a high degree of accuracy is eliminated. In addition, even when the electrode pads are further reduced in size and/or narrow-pitched, highly accurate alignment can be realized, thereby assuring electrically connecting the two wafers.

Incidentally, the melted solder is flowed in the through-holes 26 formed in the second wafer 21 thereby electrically connecting the first electrode pads 12 and the corresponding second electrode pads 22 after the placement process, in this embodiment. However, a material that is flowed into the through-holes 26 is not limited to the solder, but any material having flowability and electrical conductivity. As explained in a second embodiment, an ink, a paste-like liquid, or the like (a metal microparticle mixed liquid) may be used that is obtained by dispersing metal microparticles having electrical conductivity such as gold, silver, and platinum into a solvent.

Second Embodiment

Next, a method of manufacturing a semiconductor device according to a second embodiment is explained with reference to FIGS. 8A through 9B.

FIGS. 8A and 8B are flowcharts for explaining procedures in each of a stacking process in the method of manufacturing a semiconductor device according to this embodiment. FIGS. 9A and 9B are cross-sectional views schematically illustrating substrate structures in each of the stacking processes in the method of manufacturing a semiconductor device according to this embodiment. Incidentally, the same reference symbols are given to the same members or parts that have been explained, and the explanation thereof may be omitted.

In the method of manufacturing a semiconductor device according to this embodiment, metal microparticle mixed liquid (silver ink) where silver microparticles are dispersed in a predetermined solvent is used as the liquid, but the solder is not used.

The method of manufacturing a semiconductor device according to this embodiment includes a first hydrophilic treatment process (S21 of FIG. 8A), a liquid supplying process (S22), a second hydrophilic treatment process (S23), placement processes S24 through S27, a liquid evaporating process (S28). The placement processes includes a substrate reversing step (S24), a placement step (S25), an alignment step (S26 of FIG. 8B), and an etching step (S27). Among these, the processes from the first hydrophilic process through the placement process (S21 through S27) are the same as those from the first hydrophilic process through the placement process (S11 through S17) in the first embodiment, except for use of the silver ink as the liquid that becomes the droplets 15.

In addition, FIGS. 9A(a) through 9B(h) schematically illustrate the first wafer 11 and the second wafer 21a that go through the corresponding process S21 through S27. In this embodiment, through-holes are not necessarily formed in the second wafer 21, as shown in FIG. 9A(c), because the solder is not used.

In addition, the solder supplying step (S18) and the solder hardening step (S19) that are carried out after the placement process in the first embodiment are not carried out in this embodiment, but the liquid evaporating step (S28) is carried out. Specifically, the silver ink is hardened by evaporating the solvent in the silver ink in the liquid evaporating step, thereby electrically connecting the first electrode pads 12 and the second electrode pads 22.

In addition, other inks or paste-like liquids obtained by dispersing metals having electrical conductivity such as gold, platinum may be used as the metal microparticle mixed liquid, instead of the silver ink.

According to this embodiment, when the second wafer 21a is placed on the first wafer 11, the second wafer 21 is self-aligned with respect to the first wafer 11. This is because the second wafer 21a can move to be self-aligned with respect to the first wafer 11 in connection with that the droplets 15 of the silver ink move to come in contact with the corresponding hydrophilic surfaces 13 of the first electrode pads 12 in the first wafer 11 and the corresponding hydrophilic surfaces 23 of the second electrode pad 22 in the second wafer 21a, and because the droplets 15 of the silver ink themselves remain between the corresponding surfaces 13 and the corresponding surfaces 23, without spreading, due to surface tension of the droplets 15.

In addition, by drying the silver ink having electrical conductivity, the first electrode pads 12 are electrically connected to the corresponding second electrode pads 22, thereby reducing the number of processes.

Third Embodiment

Next, a method of manufacturing a semiconductor device according to a third embodiment is explained with reference to FIGS. 10A through 11B.

Figure 10B:
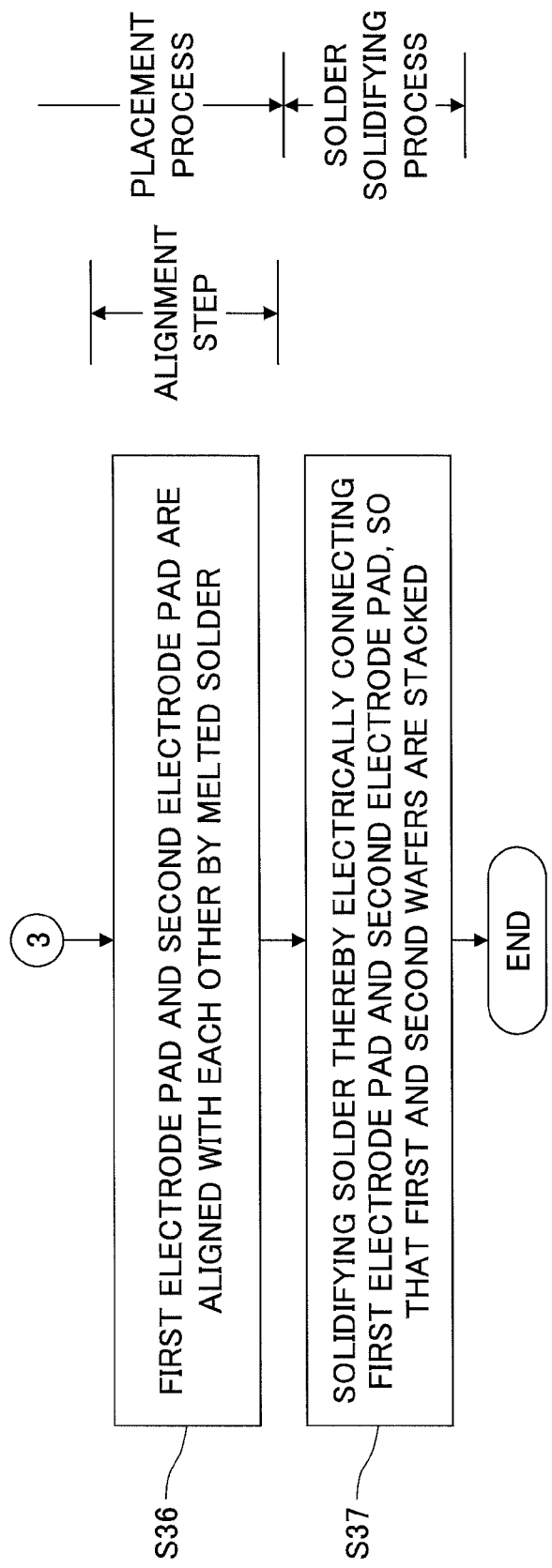
FIG. 10B is a flowchart for explaining procedures in corresponding processes of a method of manufacturing a semiconductor device, according to the third embodiment, following FIG. 10A.
Figure 11B:
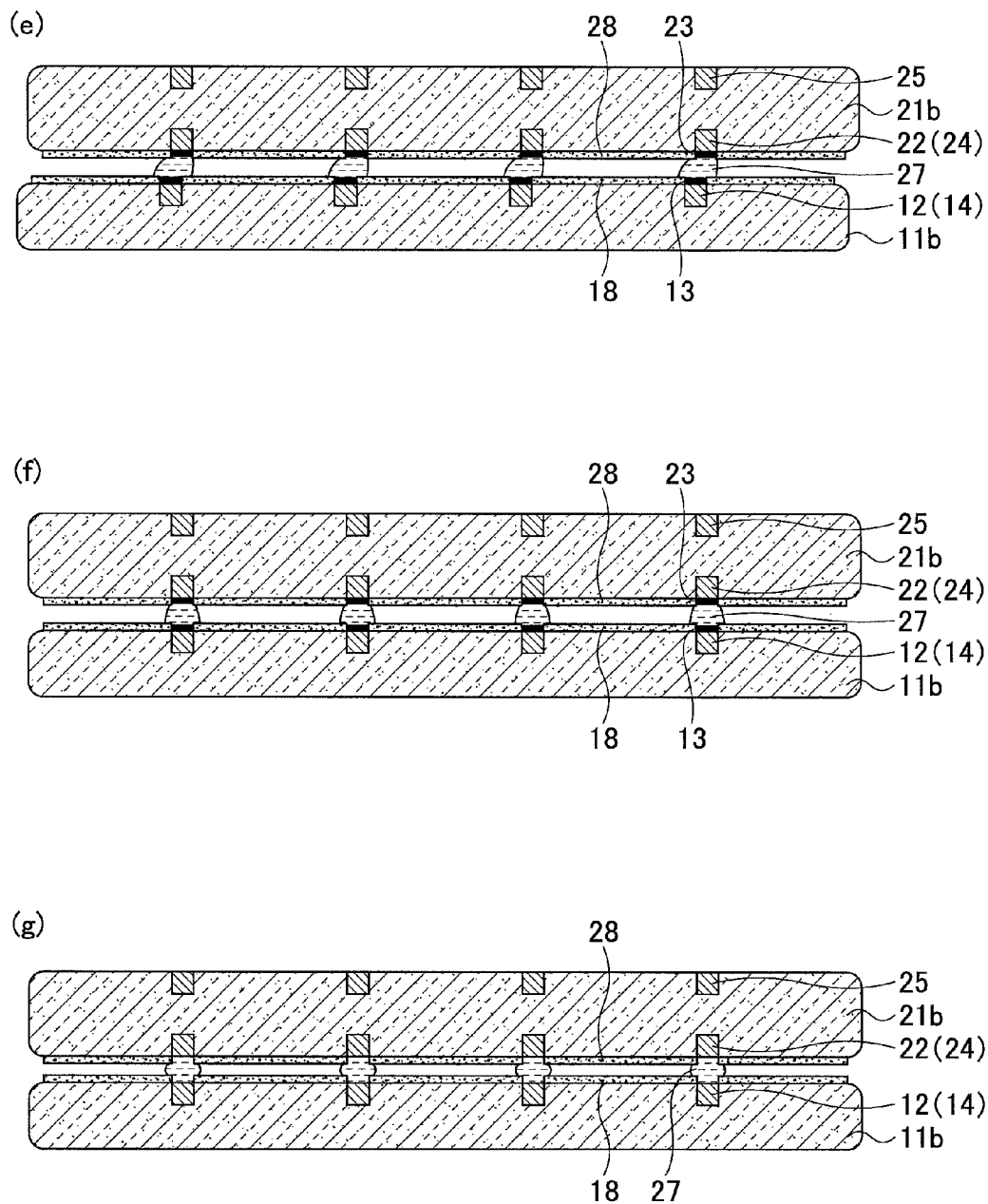
FIG. 11B schematically illustrates cross-sectional views of the substrate structures in corresponding processes of the method of manufacturing the semiconductor device, according to the third embodiment, following FIG. 11A.

FIGS. 10A and 10B are flowcharts for explaining procedures in corresponding processes of the method of manufacturing a semiconductor device according to this embodiment. FIGS. 11A through 11B schematically illustrate the corresponding step of the stacking process of the method of manufacturing a semiconductor device according to this embodiment.

In the method of manufacturing a semiconductor device according to this embodiment, melted solder is used instead of the liquid, and the alignment is carried out by the melted solder.

As shown in FIGS. 10A and 10B, a method of manufacturing a semiconductor device according to this embodiment includes a first wettability treatment process (S31 of FIG. 10A), a solder supplying process (S32), a second wettability treatment process (S33), placement processes (S34 of FIG. 10A through S36 of FIG. 10B), and a solder hardening process (S37 of FIG. 10B). The placement processes includes a substrate reversing step (S34), a placement step (S35), and an alignment step (S36).

First, the first wettability treatment (S31) is carried out. In the first wettability treatment, a first wafer 11b where first electrode pads 12 are formed is prepared, and the wettability treatment is carried out with respect to the first electrode pads 12. FIG. 11A(a) schematically illustrates the first wafer 11b that has gone through the first wettability treatment. Surfaces of the first electrode pads 12 that have gone through the first wettability treatment are represented by reference symbols 13. The wettability treatment may be carried out by applying flux.

In addition, along with the wettability treatment carried out with respect to the first electrode pads 12, areas except for the first electrode pads 12 may be covered by, for example, a solder resist or the like. In the examples shown in FIG. 11A and FIG. 11B, the areas except for the first electrode pads 12 is covered by a solder resist 18.

Incidentally, the first dummy pads 14 may be formed in the first wafer 11b, in addition to the first electrode pads 12, in the similar manner as the first embodiment.

Next, the solder supplying process (S32) is carried out. In the solder supplying process, melted solder 27 is supplied to the first wafer 11b where the surfaces 13 of the first electrode pads 12 has been subject to the wettability treatment and the areas except for the surfaces 13 have been covered by the solder resist 18. As shown in FIG. 11A(b), the melted solder 27 is supplied to and around the surfaces 13 of the first electrode pads 12, the surfaces 13 having been subject to the wettability treatment. The melted solder 27 may be supplied by, for example but not limited to, applying, spraying, or ejecting the melted solder. Incidentally, solder balls may be placed on and around the corresponding surfaces 13 of the first electrode pads 12, the surfaces 13 having been subject to the wettability treatment, while the first wafer 11b is maintained at a temperature at which the solder is not melted, and then the first wafer 11b may be heated thereby melting the solder balls. As shown in FIG. 11A(b), because the wettability treatment is carried out with respect to the surfaces 13 of the first electrode pads 12 and the areas except for the surfaces 13 are covered by the solder resist 18, the supplied melted solder 27 remains at and around the surfaces 13 of the first electrode pads 12.

In addition, when the first dummy pads 14 are formed on the first wafer 11b, the melted solder 27 is also supplied to the first dummy pads 14.

Next, the second wettability treatment (S33) is carried out. In the second wettability treatment, a second wafer 21b is prepared and the wettability treatment is carried out the second electrode pads 22 formed in the second wafer 21b. FIG. 11A(c) schematically illustrates the second wafer 21b that has gone through the second wettability treatment (S33). Surfaces of the second electrode pads 22 that have gone through the second wettability treatment are represented by reference symbols 23. The wettability treatment may be carried out by, for example but not limited to, applying flux in the similar manner as in the first wettability treatment.

In addition, along with the wettability treatment carried out with respect to the second electrode pads 22, areas except for the second electrode pads 22 may be covered by, for example, a solder resist 28 or the like, in the same manner as in the first wettability treatment. Moreover, the second dummy pads 24 may also be formed in the areas except for the second electrode pads 22 in the second wafer 21b.

Next, the placement processes (S34 through S36) are carried out. In the placement processes, the second wafer 21b is vertically reversed; the reversed second wafer 21b is placed on the first wafer 11b to which the melted solder 27 is supplied; and the first electrode pads 12 and the second electrode pads 22 are aligned. The placement processes include a substrate reversing step (S34), a placement step (S35), and an alignment step (S36). In addition, FIG. 11A(d) through FIG. 11B(f) schematically illustrate the wafers 11b and/or 21b after the corresponding steps are carried out.

First, the substrate reversing step (S34) is carried out. The substrate reversing step may be carried out in the similar manner as the substrate reversing step (S14) in the first embodiment, as shown in FIG. 11A(d).

Next, the placement step (S35) is carried out. In the placement step, the second wafer 21b is placed on the first wafer 11b so that the surface where the first electrode pads 12 are formed in the first wafer 11b opposes the surface where the second electrode pads 22 are formed in the second wafer 21b, while the melted solder 27 exists in and around the surfaces 13 of the first electrode pads 12 that has gone through the wettability treatment, as shown in FIG. 11B(e).

Here, the second wafer 21b may be placed on the first wafer 11b after the second wafer 21b is roughly aligned to the first wafer 11b by using the alignment apparatus 70 having an alignment mechanism, in the same manner as in the first embodiment.

The second wafer 21b placed on the first wafer 11b in the placement step (S35) is self-aligned with respect to the first wafer 11b, as shown in FIG. 11B(f). This is because the second wafer 21b can move relative to the first wafer 11b in connection with the melted solder 27 to come in contact with the corresponding solder-wettable surfaces 13 of the first electrode pads 12 in the first wafer 11b and the corresponding solder-wettable surfaces 23 of the second electrode pad 22 in the second wafer 21b, and because the melted solder 27 itself remains between the corresponding surfaces 13 and the corresponding surfaces 23 due to surface tension of the melted solder 27.

In addition, when the first wafer 11b has the first dummy pads 14 and the second wafer 21b has the second dummy pads 24, the first dummy pads 14 are aligned with the corresponding second dummy pads 24 by the corresponding melted solder 27.

Next, the solder hardening process (S37) is carried out. In the solder hardening process, the melted solder 27 is hardened thereby solder-connecting the first electrode pads 12 and the corresponding second electrode pads 22. FIG. 11B(g) schematically illustrates the first wafer 11b and the second wafer 21b after the solder hardening process.

As shown in FIG. 11B(g), the second wafer 21b and the first wafer 11b on which the second wafer 21b is placed are intentionally or naturally cooled, and thus the melted solder 27 is hardened, thereby electrically connecting the first electrode pads 12 and the corresponding second electrode pads 22.

In this embodiment, alignment is carried out by using the melted solder 27 without using the liquid, and then the solder is hardened, so that the first electrode pads 12 and the second electrode pads 22 can be aligned and electrically connected.

While the present invention has been described in reference to the preferable embodiments, the present invention is not limited to the particular embodiments, but may be modified or altered within the scope of the accompanying claims.

This international application claims priority based on Japanese Patent Application No. 2009-207971 filed Sep. 9, 2009, the entire content of which is incorporated herein by reference in this international application.

The invention claimed is:

1. A method of manufacturing a semiconductor device, wherein a first substrate where first electrode pads are formed and a second substrate where second electrode pads are formed are stacked and the first electrode pads and the corresponding second electrode pads are electrically connected thereby forming the semiconductor device, wherein the second substrate includes a through-hole having an opening that contacts a corresponding one of the second electrode pads, the method comprising steps of:

performing a first hydrophilic treatment with respect to the first electrode pads;

supplying a liquid to a surface where the first electrode pads are formed in the first substrate;

placing the second substrate on the first substrate to which the liquid is supplied so that the surface where the first electrode pads are formed opposes a surface where the second electrode pads are formed, thereby aligning the first electrode pads and the second electrode pads by use of the liquid that gathers in the first electrode pads that have been subject to the first hydrophilic treatment; and causing an electrically conductive liquid to flow into the through-hole from another opening open in a surface of the second substrate, the surface opposing a surface facing the first substrate, thereby electrically connecting the first electrode pads and the second electrode pads, after the step of placing.

2. The method of manufacturing a semiconductor device according to claim 1, further comprising performing a second hydrophilic treatment with respect to the second electrode pads.

3. The method of manufacturing a semiconductor device according to claim 1, wherein the liquid has an etching capability with respect to an oxide film formed on surfaces of the first electrode pads and/or the second electrode pads.

4. The method of manufacturing a semiconductor device according to claim 1, wherein the liquid has an electrical conductivity.

5. The method of manufacturing a semiconductor device according to claim 1, wherein the step of placing is performed under a reduced pressure environment, and wherein a pressure of the reduced pressure environment is raised to atmospheric pressure after supplying the electrically conductive liquid in the step of supplying the electrically conductive liquid.

6. The method of manufacturing a semiconductor device according to claim 1, wherein the first substrate is provided with a first dummy pad, wherein the second substrate is provided with a second dummy pad, and wherein the first hydrophilic treatment is performed with respect to the first dummy pad in the step of performing the first hydrophilic treatment.

7. The method of manufacturing a semiconductor device according to claim 6, wherein a hydrophilic treatment is performed with respect to the second dummy pad.

8. A method of electrically connecting between a first electrode and a second electrode, said first electrode formed on a first substrate and said second electrode corresponding to said first electrode and formed on a second substrate having a through-hole formed therein that contacts said second electrode, the method comprising steps of:

supplying a liquid to a surface on which the first electrode is formed on the first substrate; and placing the second substrate at the first substrate such that the surface on which the first electrode is formed opposes a surface on which the second electrode is formed;

wherein, in the placing step, alignment of the first electrode and the second electrode is performed by said liquid;

wherein the method further comprises, after said placing step, causing an electrically conductive liquid to flow into said through-hole, from a surface of said second substrate that is opposite a surface of said second substrate that opposes said first substrate, thereby electrically connecting the first electrode and the second electrode.

* * * * *